US012766968B2

(12) United States Patent
Huang et al.

(10) Patent No.: US 12,766,968 B2
(45) Date of Patent: Oct. 20, 2026

(54) SYSTEMS AND METHODS FOR SYNCHRONOUS MOTOR SYSTEM DIAGNOSTICS

(71) Applicant: ROCKWELL AUTOMATION TECHNOLOGIES, INC., Mayfield Heights, OH (US)

(72) Inventors: Yuhong Huang, Acton, MA (US); Michaela R. Kaufmann, Chelmsford, MA (US); Daniel I. Lanier, North Billerica, MA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 753 days.

(21) Appl. No.: 18/195,278

(22) Filed: May 9, 2023

(65) Prior Publication Data

US 2024/0375518 A1 Nov. 14, 2024

(51) Int. Cl.
*B60L 3/12* (2006.01)
*B60L 3/00* (2019.01)
(Continued)

(52) U.S. Cl.
CPC ............... *B60L 3/12* (2013.01); *B60L 3/0061* (2013.01); *B60L 13/03* (2013.01); *B60L 15/005* (2013.01);
(Continued)

(58) Field of Classification Search
CPC .......... B60L 3/12; B60L 3/0061; B60L 13/03; B60L 15/005; B61B 13/12; B65G 35/06;
(Continued)

(56) References Cited

U.S. PATENT DOCUMENTS 10,432,117 B1 10/2019 Huang et al.
10,442,637 B2 10/2019 Huang et al.
(Continued)

FOREIGN PATENT DOCUMENTS

JP 2011173673 A * 9/2011 ....... H01L 21/67727
JP 2022-162252 A 10/2022

OTHER PUBLICATIONS

U.S. Appl. No. 18/079,254.
(Continued)

*Primary Examiner* — Zachary L Kuhfuss
(74) *Attorney, Agent, or Firm* — Foley & Lardner LLP

(57) ABSTRACT

A system for detecting linear drive system faults includes a track, a calibrated inspection apparatus, and processing circuitry. The track includes track segments defining a path along which movers travel. Drive coils induce travel of the movers along the track. The calibrated inspection apparatus includes (i) a calibrated inspection mover that travels along the track and/or (ii) a calibrated inspection station including one or more of the track segments. The processing circuitry obtains feedback signals from controllers for the track segments. The feedback signals characterize relative motion between the calibrated inspection apparatus and (i) the track segments and/or (ii) the movers. The processing circuitry determines a fault based on the feedback signals and calibrated characteristics of the calibrated inspection apparatus. The fault includes at least one of (i) a track segment fault in the track segments or (ii) a mover fault in the movers.

20 Claims, 14 Drawing Sheets

(51) Int. Cl.

| | |
|---|---|
| ***B60L 13/03*** | (2006.01) |
| ***B60L 15/00*** | (2006.01) |
| ***B61B 13/12*** | (2006.01) |
| ***B61L 27/60*** | (2022.01) |
| ***B65G 35/06*** | (2006.01) |
| ***B65G 43/00*** | (2006.01) |
| ***B65G 43/02*** | (2006.01) |
| ***B65G 54/02*** | (2006.01) |
| ***H02P 6/00*** | (2016.01) |
| ***H02P 6/18*** | (2016.01) |
| ***H02P 29/024*** | (2016.01) |
| *G01R 31/34* | (2020.01) |

(52) U.S. Cl.
CPC .............. *B61B 13/12* (2013.01); *B61L 27/60* (2022.01); *B65G 35/06* (2013.01); *B65G 43/00* (2013.01); *B65G 43/02* (2013.01); *B65G 54/02* (2013.01); *H02P 6/006* (2013.01); *H02P 6/183* (2013.01); *H02P 29/024* (2013.01); *H02P 29/027* (2013.01); *B65G 2203/0283* (2013.01); *G01R 31/346* (2013.01)

(58) Field of Classification Search
CPC ........ B65G 43/00; B65G 43/02; B65G 54/02; B65G 2203/0283; B61L 27/60; H02P 6/006; H02P 6/183; G01R 31/346
See application file for complete search history.

(56) References Cited

U.S. PATENT DOCUMENTS

| | | | | |
|---|---|---|---|---|
| 10,562,715 | B2 | 2/2020 | Huang | |
| 10,914,620 | B2 * | 2/2021 | Huang | G01D 18/006 |
| 11,165,372 | B2 | 11/2021 | Huang | |
| 11,307,067 | B2 | 4/2022 | Huang et al. | |
| 11,459,181 | B2 | 10/2022 | Huang | |
| 2019/0077608 | A1 * | 3/2019 | Huang | B65G 43/02 |
| 2019/0079135 | A1 * | 3/2019 | Shirazi | G01R 31/34 |
| 2020/0148481 | A1 * | 5/2020 | Huang | B65G 35/06 |
| 2021/0341901 | A1 * | 11/2021 | Miklosovic | G05B 19/406 |
| 2022/0027529 | A1 | 1/2022 | Zarur et al. | |
| 2022/0207925 | A1 | 6/2022 | Kim et al. | |
| 2022/0340369 | A1 | 10/2022 | Mignano | |
| 2022/0411196 | A1 | 12/2022 | Das et al. | |
| 2024/0175883 | A1 * | 5/2024 | Aoyama | B65G 54/02 |

OTHER PUBLICATIONS

U.S. Appl. No. 18/152,888.
EP Search Report for EP Application No. 24172706.4, dated Sep. 27, 2024, pp. 1-9.

* cited by examiner

SYSTEMS AND METHODS FOR SYNCHRONOUS MOTOR SYSTEM DIAGNOSTICS

BACKGROUND

The present disclosure relates generally to a linear drive system. More specifically, the present disclosure relates to a control system for a linear drive system.

SUMMARY

One implementation of the present disclosure is a system for detecting a fault of a linear drive system, according to some embodiments. In some embodiments, the system includes a track, a calibrated inspection apparatus, and processing circuitry. In some embodiments, the track includes multiple track segments defining a path along which multiple movers travel. In some embodiments, multiple drive coils are configured to induce travel of the movers along the track. In some embodiments, the calibrated inspection apparatus includes at least one of (i) a calibrated inspection mover configured to travel along the track or (ii) a calibrated inspection station including one or more of the track segments. In some embodiments, the processing circuitry is configured to obtain feedback signals from one or more controllers for the track segments. In some embodiments, the feedback signals characterize relative motion between the calibrated inspection apparatus and at least one of (i) the track segments or (ii) the movers. In some embodiments, the processing circuitry is configured to determine a fault based on the feedback signals and one or more calibrated characteristics of the calibrated inspection apparatus. In some embodiments, the fault includes at least one of (i) a track segment fault in the track segments or (ii) a mover fault in the movers.

In some embodiments, the calibrated inspection station is positioned on a bypass track defining a bypass path in parallel with one or more of the track segments. In some embodiments, the processing circuitry is further configured to cause a tested mover of the movers to travel along the bypass path in response to a signal to inspect the tested mover.

In some embodiments, the drive coils are configured to be energized sequentially to induce the travel of the movers along the track. In some embodiments, a degree of energization of the drive coils corresponds to a speed or thrust of the travel of the movers. In some embodiments, the track includes multiple sensors. In some embodiments, the feedback signals include position signals characterizing the relative motion between the calibrated inspection apparatus and at least one of (i) the track segments or (ii) the movers. In some embodiments, the position signals indicate a position and speed of each of the movers or the calibrated inspection mover along the track.

In some embodiments, the one or more calibrated characteristics of the calibrated inspection apparatus include at least one of a calibrated magnet array of the calibrated inspection mover, calibrated bearings and wheels of the calibrated inspection mover, calibrated vertical gaps between the calibrated inspection mover and the track, or a calibrated weight of the calibrated inspection mover. In some embodiments, the feedback signals include an actual current through the drive coils. In some embodiments, the processing circuitry is configured to determine the fault by performing a track test including causing sequential energization of the drive coils according to a commanded current to induce travel of the calibrated inspection mover along the track segments, and determining, based on the commanded current of the drive coils and the actual current through the drive coils, a fault of one of more of the track segments.

In some embodiments, determining the fault includes at least one of identifying a sensor fault of one or more of multiple sensors of the track based on at least one of an amplitude or shape of a position signal obtained from the one or more of the sensors differing from an expected amplitude or shape. In some embodiments, determining the fault includes identifying a coil fault based on an actual coil current differing from a commanded current of one of the drive coils. In some embodiments, determining the fault includes identifying a track bearing wear fault or a debris on track fault based on the commanded current corresponding to the actual coil current and exceeding a value predicted to induce the travel of the calibrated inspection mover.

In some embodiments, the processing circuitry is configured to determine, based on position signals obtained from position sensors of the track, an actual position of the calibrated inspection mover. In some embodiments, the processing circuitry is configured to determine, based on one or more characteristics of the calibrated inspection mover, a commanded current to the drive coils, and a predictive model, a predicted position of the calibrated inspection mover along the track responsive to the commanded current. In some embodiments, the processing circuitry is configured to determine, based on the actual position differing from the predicted position, a track bearing wear fault or a debris on track fault.

In some embodiments, the calibrated inspection station includes multiple calibrated sensors, a calibrated coil and current driver, and a calibrated track segment. In some embodiments, the processing circuitry is configured to perform a mover test by causing sequential energization of the drive coils to induce travel of a tested mover of the movers along the calibrated inspection station. In some embodiments, the processing circuitry is configured to perform the mover test by operating the calibrated coil according to a predetermined test profile while obtaining position signals from the calibrated sensors. In some embodiments, the processing circuitry is configured to perform the mover test by determining, based on at least one of the position signals from the calibrated sensors or a commanded current of the calibrated coil, a fault at the tested mover. In some embodiments, the fault includes at least one of a bearing wear fault or a magnet array fault of the tested mover.

In some embodiments, the processing circuitry is configured to determine the fault by determining, based on the feedback signals, the fault and a type of the fault using a neural network trained using aggregated data of the feedback signals and corresponding faults and types of faults. In some embodiments, the processing circuitry is further configured to aggregate the feedback signals associated with the movers. In some embodiments, the processing circuitry is configured to generate a model of a virtual mover. In some embodiments, the model of the virtual mover includes attributes that are representative of the movers. In some embodiments, the processing circuitry is configured to predict, based on changes of the attributes of the model of the virtual mover over time, a compensation for wear of the movers.

Another implementation of the present disclosure is a method for detecting a fault of a linear drive system, according to some embodiments. In some embodiments, the method includes operating multiple drive coils to induce travel of multiple movers along a track. In some embodiments, the track includes multiple track segments that define a path along which the movers travel. In some embodiments, the method includes providing a calibrated inspection apparatus including at least one of (i) a calibrated inspection mover of the movers or (ii) a calibrated inspection station of the track segments. In some embodiments, the method includes obtaining feedback signals from one or more controllers for the track segments. In some embodiments, the feedback signals characterize relative motion between the calibrated inspection apparatus and at least one of (i) the track segments or (ii) the movers. In some embodiments, the method includes determining a fault based on the feedback signals and the one or more calibrated characteristics of the calibrated inspection apparatus. In some embodiments the fault includes at least one of (i) a track segment fault in the track segments or (ii) a mover fault in the movers.

In some embodiments, the method includes performing a track test by causing sequential activation of the drive coils according to a commanded current to induce the travel of the calibrated inspection mover along the track segments. In some embodiments, the track test includes determining, based on position signals obtained from multiple sensors of the track, the commanded current of the drive coils, and an actual current through the drive coils, a fault of one of more of the track segments.

In some embodiments, the method includes identifying a sensor fault of one or more of the sensors of the track based on at least one of an amplitude or shape of the position signals obtained from the one or more of the sensors differing from an expected amplitude or shape. In some embodiments, the method includes identifying a coil fault based on an actual coil current differing from the commanded current. In some embodiments, the method includes identifying a track bearing wear fault or a debris on track fault based on the commanded current corresponding to the actual coil current and exceeding a value predicted to induce the travel of the calibrated inspection mover.

In some embodiments, the method includes determining, based on the position signals, an actual position of the calibrated inspection mover. In some embodiments, the method also includes determining, based on one or more characteristics of the calibrated inspection mover, the commanded current, and a predictive model, a predicted position of the calibrated inspection mover along the track responsive to the commanded current. In some embodiments, the method includes determining, based on the actual position differing from the predicted position, a track bearing wear fault or a debris on track fault.

In some embodiments, the method includes performing a mover test by causing sequential energization of the drive coils to induce the travel of the mover to the calibrated inspection station. In some embodiments, the method includes operating a calibrated coil according to a predetermined test profile while obtaining position signals from multiple calibrated sensors of the calibrated inspection station. In some embodiments, the method includes determining, based on at least one of the position signals from the calibrated sensors or a commanded current of the calibrated coil, a fault at the mover. In some embodiments, the fault includes at least one of a bearing wear fault or a magnet array fault of the mover.

Another implementation of the present disclosure is a method for detecting a fault of a linear drive system and controlling the linear drive system, according to some embodiments. In some embodiments, the method includes performing a measurement of a characteristic of a calibrated inspection mover or a calibrated inspection station. In some embodiments, the method includes controlling activation of multiple coils of a track of the linear drive system to at least one of (i) conduct a track test of a tested segment of the track by transporting the calibrated inspection mover along the tested segment of the track or (ii) conduct a mover test by transporting a tested mover along the calibrated inspection station. In some embodiments, the method includes obtaining sensor feedback from sensors of the track while conducting at least one of the track test or the mover test. In some embodiments, the method includes determining, based on the sensor feedback and the measurement of the characteristic of the calibrated inspection mover or the calibrated inspection station, at least one of a fault of the tested mover or a fault of the tested segment of the track.

In some embodiments, determining the at least one of the fault of the tested mover or the fault of the particular portion of the track includes determining a predicted response of the calibrated inspection mover or the tested mover to a test profile based on the measurement of the characteristic of the calibrated inspection mover or the calibrated inspection station. In some embodiments, the method includes determining an actual response of the calibrated inspection mover or the tested mover to the test profile by activating the coils of the track of the linear drive system according to the test profile when performing the track test or the mover test. In some embodiments, the actual response is indicated by the sensor feedback. In some embodiments, the method includes comparing the actual response of the calibrated inspection mover or the tested mover to the predicted response of the calibrated inspection mover or the tested mover. In some embodiments, a deviation of the actual response from the predicted response indicates the fault of the tested mover or the fault of the tested segment of the track.

In some embodiments, the method includes obtaining sensor feedback and corresponding control commands of each of multiple different movers. In some embodiments, the method includes generating, based on the sensor feedback and the corresponding control commands of each of the different movers, an aggregated model of the different movers. In some embodiments, the aggregated model is a virtual representation of a virtual mover that reflects characteristics of each of the different movers. In some embodiments, the method includes updating or calibrating the aggregated model. In some embodiments, the method includes, responsive to changes in the aggregated model indicating degradation of the different movers, adjusting a control scheme for each of the different movers.

In some embodiments, the method includes providing a repair mover. In some embodiments, the repair mover includes at least one of a bumper or a brush. In some embodiments, the method includes controlling activation of the coils to transport the repair mover along a particular location on the track where a fault is detected and clear debris off the track using the bumper or the brush.

In some embodiments, the method includes conducting sensors tests of each of multiple sensors of the track. In some embodiments, the method includes identifying defective sensors based on sensor feedback from each of the sensors. In some embodiments, the method includes marking the defective sensors and modifying a control algorithm for controlling energization of the coils such that the control algorithm does not use feedback from the defective sensors as inputs to the control algorithm.

This summary is illustrative only and is not intended to be in any way limiting. Other aspects, inventive features, and advantages of the devices or processes described herein will become apparent in the detailed description set forth herein, taken in conjunction with the accompanying figures, wherein like reference numerals refer to like elements.

BRIEF DESCRIPTION OF THE FIGURES

The disclosure will become more fully understood from the following detailed description, taken in conjunction with the accompanying figures, wherein like reference numerals refer to like elements, in which.

DETAILED DESCRIPTION

Figure 1:
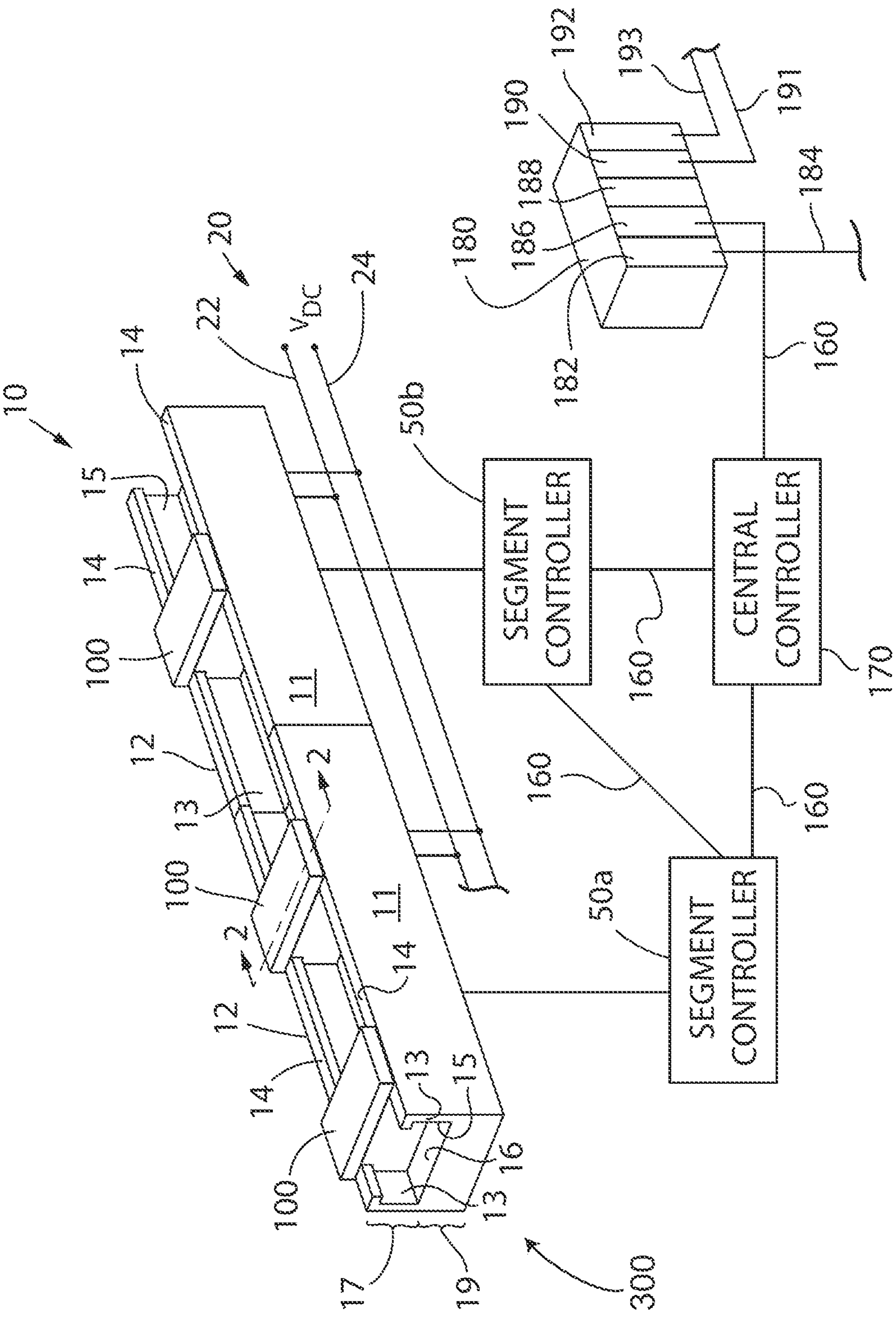
FIG. 1 is a schematic representation of an exemplary control system for a linear drive system, according to some embodiments.

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

Referring generally to the FIGURES, a linear drive system includes a track having multiple track segments, and movers that travel along the track. The track segments can each include an array of drive coils, and each of the movers may include an array of magnets. The drive coils can be sequentially activated in order to induce transportation of the movers along the track. The linear drive system may also include a fault detection system including an inspection vehicle having calibrated magnets and geometry, or an inspection station having calibrated drive coils. The inspection vehicle may travel along the track in order to identify faults of one or more of the track segments. Likewise, one or more movers of the linear drive system may be transported over the inspection station in order to test and identify faults of the one or more movers.

The fault detection system may also advantageously facilitate or perform one or more permanent vehicle identification techniques based on array characteristics or responses of the vehicles. Advantageously, the improved vehicle identification may facilitate improved control and tracking of the movers.

System Overview

Referring to FIGS. 1-4, a transport system (e.g., a linear drive system 300, an induction drive system, etc.) for moving articles or products includes a track 10 having multiple segments 12. In some embodiments, multiple segments 12 are coupled with each other and arranged end-to-end (e.g., serially) to define the overall track configuration. The segments 12 may be straight segments having generally the same length. In some embodiments, the segments 12 have various sizes, lengths, and shapes and can be coupled with each other to form the track 10 according to a desired shape (e.g., an elliptical path, a circular path, etc.). In some embodiments, track segments 12 may be coupled with each other to form a generally closed loop that supports one or more movers 100 (e.g., carts, trains, movable blocks, etc.) that are movable along the track 10. The track 10 is illustrated in a horizontal plane. For convenience, the horizontal orientation of the track 10 shown in FIG. 1 will be discussed herein. Terms such as upper, lower, inner, and outer will be used with respect to the illustrated track orientation. These terms are relational with respect to the illustrated track and are not intended to be limiting. It is understood that the track may be installed in different orientations, such as sloped or vertical, and include different shaped segments including, but not limited to, straight segments, inward bends, outward bends, up slopes, down slopes and various combinations thereof. The width of the track 10 may be greater in either the horizontal or vertical direction according to application requirements. The movers 100 will travel along the track and take various orientations according to the configuration of the track 10 and the relationships discussed herein may vary accordingly.

According to some embodiments, each track segment 12 includes an upper portion 17 and a lower portion 19. The upper portion 17 is configured to couple with (e.g., slidably, translatably, etc.) and support the movers 100, according to some embodiments. In some embodiments, the lower portion 19 is configured to house one or more control elements. In some embodiments, the upper portion 17 includes a generally u-shaped channel 15 extending longitudinally along the upper portion 17 of each segment. The channel 15 includes a bottom surface 16 and a pair of side walls 13, according to some embodiments. In some embodiments, each side wall 13 includes a rail 14 extending along an upper edge of the side wall 13. The bottom surface 16, side walls 13, and rails 14 may extend longitudinally along the track segment 12 and define a guideway along which the movers 100 travel. In some embodiments, the surfaces of the channel 15 (i.e., the bottom surface 16, side walls 13 and rails 14) are planar surfaces made of a low friction material along which movers 100 may slide. In some embodiments, the contacting surfaces of the movers 100 may also be planar and made of a low friction material. In some embodiments, the surface may be, for example, nylon, Teflon®, aluminum, stainless steel, etc. In some embodiments, the contacting surfaces of the movers 100 are provided as a slidable bearing which may degrade over time. In some embodiments, the hardness of the surfaces on the track segment 12 are greater than the contacting surface of the movers 100 such that the contacting surfaces of the movers 100 wear faster than the surface of the track segment 12. In some embodiments, the contacting surfaces of the movers 100 may be removably mounted to the housing 11 of the mover 100 such that they may be replaced if the wear exceeds a predefined amount. In some embodiments, the movers 100 may include low-friction rollers to engage the surfaces of the track segment 12. The low-friction rollers may include bearings. In some embodiments, the surfaces of the channel 15 may include different cross-sectional forms with the mover 100 including complementary sectional forms. In some embodiments, the track segment 12 and mover have other combinations of shapes and construction such that the mover 100 can interface with (e.g., rest upon, hang upon, etc.) the track segments 12 and travel along the track segments 12.

In some embodiments, each mover 100 is configured to slide along the channel 15 as it is propelled by a linear drive system 300. The mover 100 includes a body 102 configured to fit within the channel 15, according to some embodiments. The body 102 includes a lower surface 106, configured to engage the bottom surface 16 of the channel, and side surfaces 108 configured to engage the side walls 13 of the channel, according to some embodiments. In some embodiments, the mover 100 further includes a shoulder 105 extending inward from each of the side surfaces 108. In some embodiments, the shoulder 105 has a width equal to or greater than the width of the rail 14 protruding into the channel. In some embodiments, a neck of the mover extends upward to a top surface 104 of the body 102. In some embodiments, the neck extends for the thickness of the rails such that the top surface 104 of the body 102 is generally parallel with the upper surface 32 of each rail 14. In some embodiments, the mover 100 further includes a platform 110 secured to the top surface 104 of the body 102. In some embodiments, the platform 110 is generally square and the width of the platform 110 is greater than the width between the rails 14. In some embodiments, the lower surface 114 of the platform 110, an outer surface of the neck, and an upper surface of the shoulder 105 define a channel 115 in which the rail 14 runs. In some embodiments, the channel 115 serves as a guide to direct the mover 100 along the track. In some embodiments, one or more platforms or attachments of various shapes may be secured to the top surface 104 of the body 102. Further, various workpieces, clips, fixtures, and the like may be mounted on the top 112 of each platform 110 for engagement with a product to be carried along the track by the mover 100. The platform 110 and any workpiece, clip, fixture, or other attachment present on the platform may define, at least in part, a load present on the mover 100.

Figure 3:
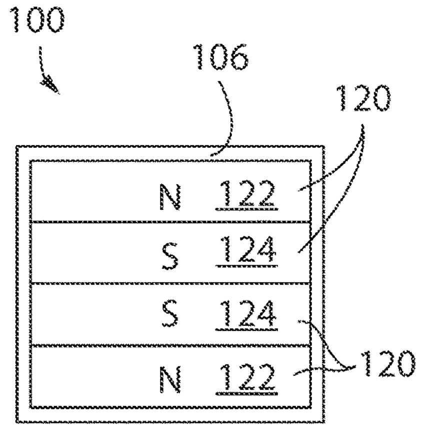
FIG. 3 is a bottom plan view of the mover of FIG. 2, according to some embodiments.
Figure 4:
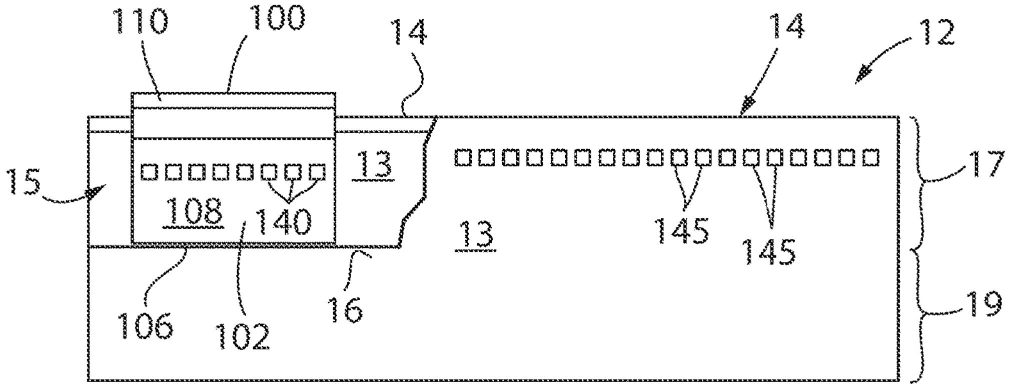
FIG. 4 is a partial side cutaway view of the mover and track segment of FIG. 2, according to some embodiments.

The mover 100 is induced or driven to move (e.g., travel) along the track 10 by a linear drive system 300, according to some embodiments. The linear drive system 300 is incorporated in part on each mover 100 and in part within each track segment 12, according to some embodiments. One or more drive magnets 120 are mounted to each mover 100. With reference to FIG. 3, the drive magnets 120 are arranged in a block on the lower surface of each mover. The drive magnets 120 include positive magnet segments 122, having a north pole, N, facing outward from the mover and negative magnet segments 124, having a south pole, S, facing outward from the mover, according to some embodiments. In some embodiments, two positive magnet segments 122 are located on the outer sides of the set of magnets and two negative magnet segments 124 are located between the two positive magnet segments 122. In some embodiments, the positive and negative motor segments are placed in an alternating configuration. In some embodiments, a single negative magnet segment 124 may be located between the positive magnet segments 122. Various other configurations of the drive magnets 120 may be utilized according to some embodiments. In some embodiments, the positive magnet segments 122 are half-width magnets while the negative magnet segments 124 are full width magnets. While FIG. 3 illustrates a single cycle magnet array, the mover 100 may also or alternatively be driven to move along the track 10 by drive magnets 120 arranged in a two cycle array (e.g., a stack of magnets alternating between full north pole N magnets and half segment south pole S magnets).

Figure 5:
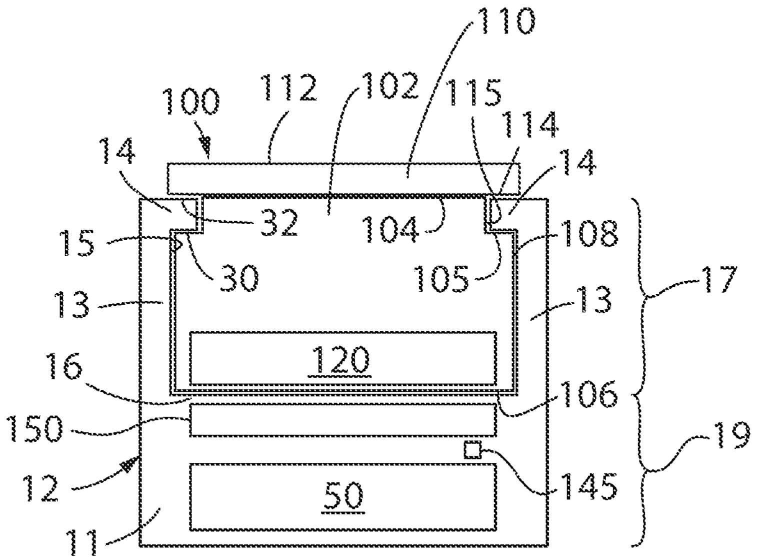
FIG. 5 is a sectional view of another embodiment of a mover and track segment included in the linear drive system taken at 2-2 of FIG. 1, according to some embodiments.

The linear drive system 300 further includes a series of coils 150 spaced along the length of the track segment 12. With reference also to FIG. 5, the coils 150 may be positioned within a housing 11 for the track segment 12 and below the bottom surface 16 of the channel 15. The coils 150 are energized sequentially according to the configuration of the drive magnets 120 present on the movers 100. The sequential energization of the coils 150 generates a moving electromagnetic field that interacts with the magnetic field of the drive magnets 120 to propel each mover 100 along the track segment 12.

Figure 2:
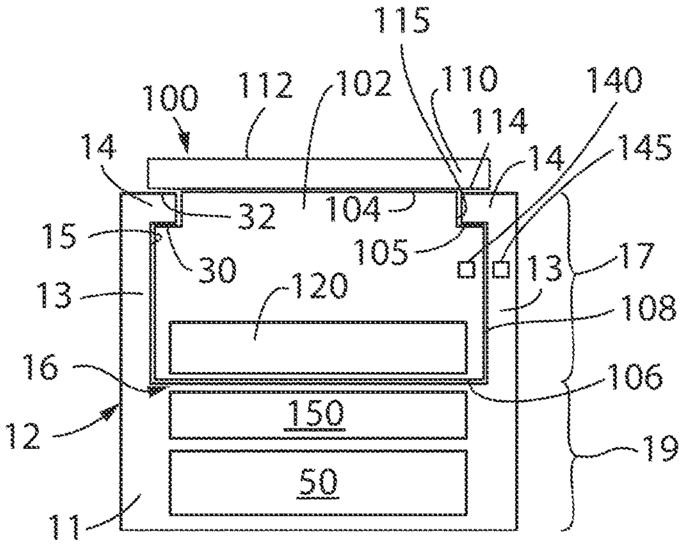
FIG. 2 is a sectional view of a mover and track segment included in the linear drive system taken at 2-2 of FIG. 1, according to some embodiments.

A segment controller 50 is provided within each track segment 12 to control the linear drive system 300 and to achieve the desired motion of each mover 100 along the track segment 12. Although illustrated in FIG. 1 as blocks external to the track segments 12, the arrangement is to facilitate illustration of interconnects between controllers. As shown in FIG. 2, it is contemplated that each segment controller 50 may be mounted in the lower portion 19 of the track segment 12. A first segment controller 50 *a* is shown with a first track segment, and a second segment controller 50 *b* is shown with a second track segment. It is contemplated that any number "n" of segment controllers 50 *n* (see FIG. 8) may be included in the linear drive system 300. Each segment controller 50 is in communication with a central controller 170 which is, in turn, in communication with an industrial controller 180. The industrial controller may be, for example, a programmable logic controller (PLC) configured to control elements of a process line stationed along the track 10. The process line may be configured, for example, to fill and label boxes, bottles, or other containers loaded onto or held by the movers 100 as they travel along the line. In other embodiments, robotic assembly stations may perform various assembly and/or machining tasks on workpieces carried along by the movers 100. The exemplary industrial controller 180 includes: a power supply 182 with a power cable 184 connected, for example, to a utility power supply; a communication module 186 connected by a network medium 160 to the central controller 170; a processor module 188; an input module 190 receiving input signals 191 from sensors or other devices along the process line; and an output module 192 transmitting control signals 193 to controlled devices, actuators, and the like along the process line. The processor module 188 may identify when a mover 100 is required at a particular location and may monitor sensors, such as proximity sensors, position switches, or the like to verify that the mover 100 is at a desired location. The processor module 188 transmits the desired locations of each mover 100 to a central controller 170 where the central controller 170 operates to generate commands for each segment controller 50.

Figure 8:
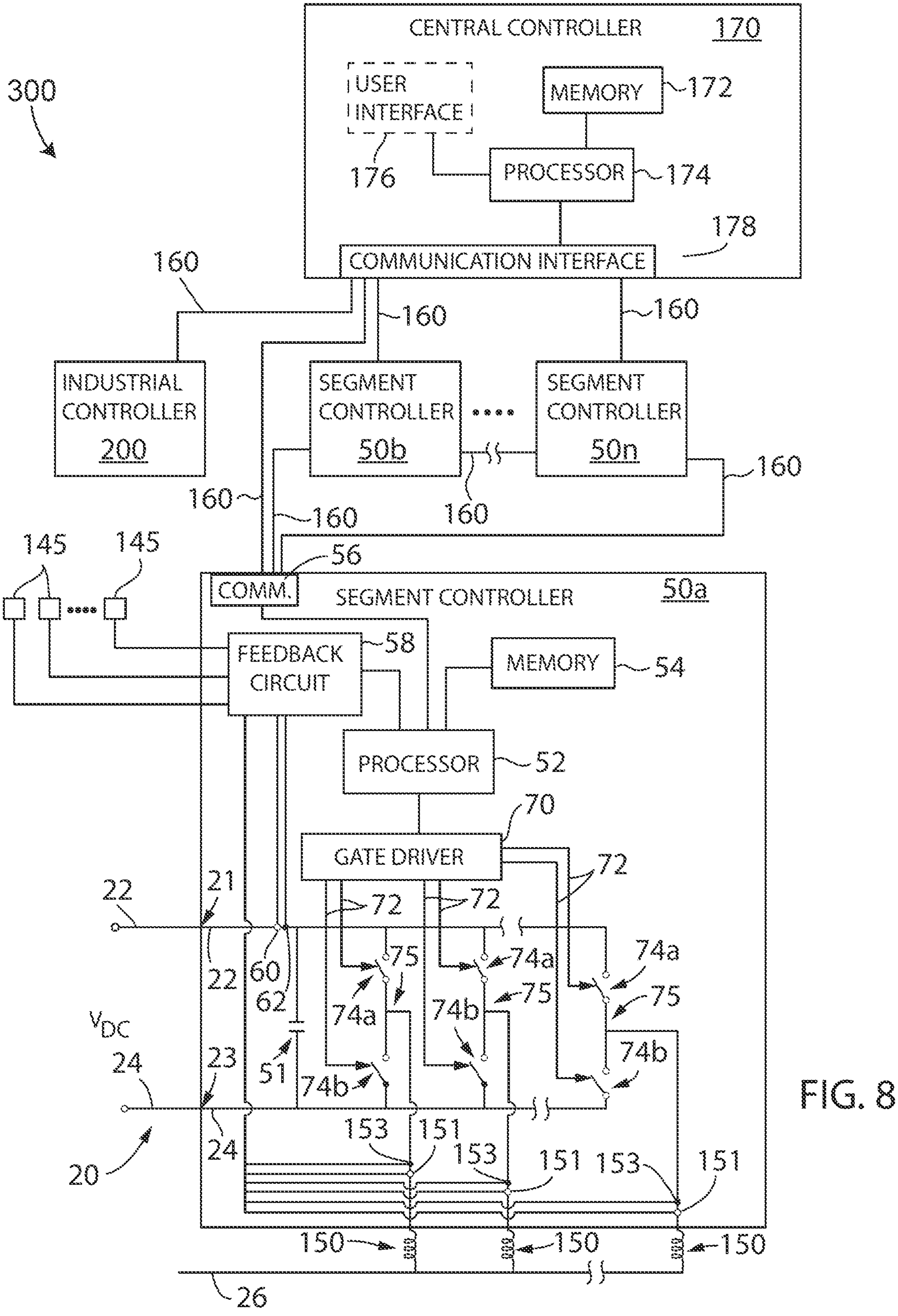
FIG. 8 is a block diagram representation of the control system of FIG. 1, according to some embodiments.

With reference also to FIG. 8, the central controller 170 includes a processor 174 and a memory device 172. It is contemplated that the processor 174 and memory device 172 may each be a single electronic device or formed from multiple devices. The processor 174 may be a microprocessor. In some embodiments, the processor 174 and/or the memory device 172 may be integrated on a field programmable gate array (FPGA) or an application specific integrated circuit (ASIC). The memory device 172 may include volatile memory, non-volatile memory, or a combination thereof. An optional user interface 176 may be provided for an operator to configure the central controller 170 and to load or configure desired motion profiles for the movers 100 on the central controller 170. In some embodiments, the configuration may be performed via a remote device connected via a network and a communication interface 178 to the central controller 170. It is contemplated that the system controller 170 and user interface 176 may be a single device, such as a laptop, notebook, tablet or other mobile computing device. In some embodiments, the user interface 176 may include one or more separate devices such as a keyboard, mouse, display, touchscreen, interface port, removable storage medium or medium reader and the like for receiving information from and displaying information to a user. In some embodiments, the system controller 170 and user interface may be an industrial computer mounted within a control cabinet and configured to withstand harsh operating environments. In some embodiments, still other combinations of computing devices and peripherals may be utilized or incorporated into the system controller 170 and user interface 176.

The central controller 170 includes one or more programs stored in the memory device 172 for execution by the processor 174. The system controller 170 receives a desired position from the industrial controller 180 and determines one or more motion profiles for the movers 100 to follow along the track 10. A program executing on the processor 174 is in communication with each segment controller 50 on each track segment via a network medium 160. The system controller 170 may transfer a desired motion profile to each segment controller 50. In some embodiments, the system controller 170 may be configured to transfer the information from the industrial controller 180 identifying one or more desired movers 100 to be positioned at or moved along the track segment 12, and the segment controller 50 may determine the appropriate motion profile for each mover 100.

A position feedback system provides knowledge of the location of each mover 100 along the length of the track segment 12 to the segment controller 50. According to some embodiments, illustrated in FIGS. 2 and 4, the position feedback system includes one or more position magnets 140 mounted to the mover 100 and an array of sensors 145 spaced along the side wall 13 of the track segment 12. The sensors 145 are positioned such that each of the position magnets 140 are proximate to the sensor as the mover 100 passes each sensor 145. The sensors 145 are a suitable magnetic field detector including, for example, a Hall Effect sensor, a magneto-diode, an anisotropic magnetoresistive (AMR) device, a giant magnetoresistive (GMR) device, a tunnel magnetoresistance (TMR) device, fluxgate sensor, or other microelectromechanical (MEMS) device configured to generate an electrical signal corresponding to the presence of a magnetic field. The magnetic field sensor 145 outputs a feedback signal provided to the segment controller 50 for the corresponding track segment 12 on which the sensor 145 is mounted. The feedback signal may be an analog signal provided to a feedback circuit 58 which, in turn, provides a signal to the processor 52 corresponding to the magnet 140 passing the sensor 145.

Figure 6:
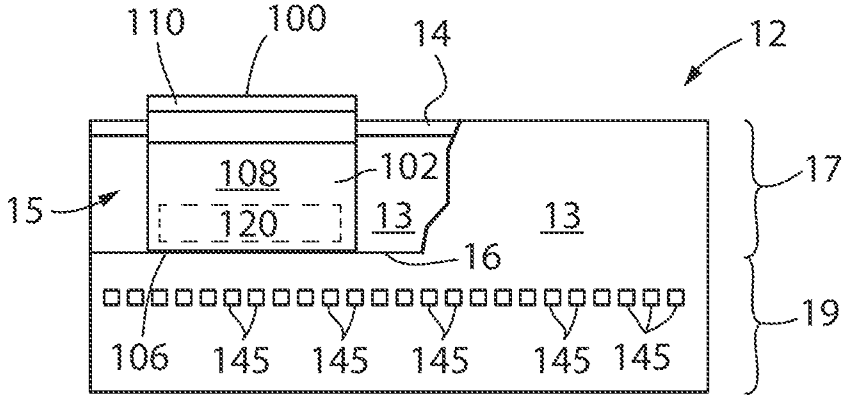
FIG. 6 is a partial side cutaway view of the mover and track segment of FIG. 5, according to some embodiments.
Figure 7:
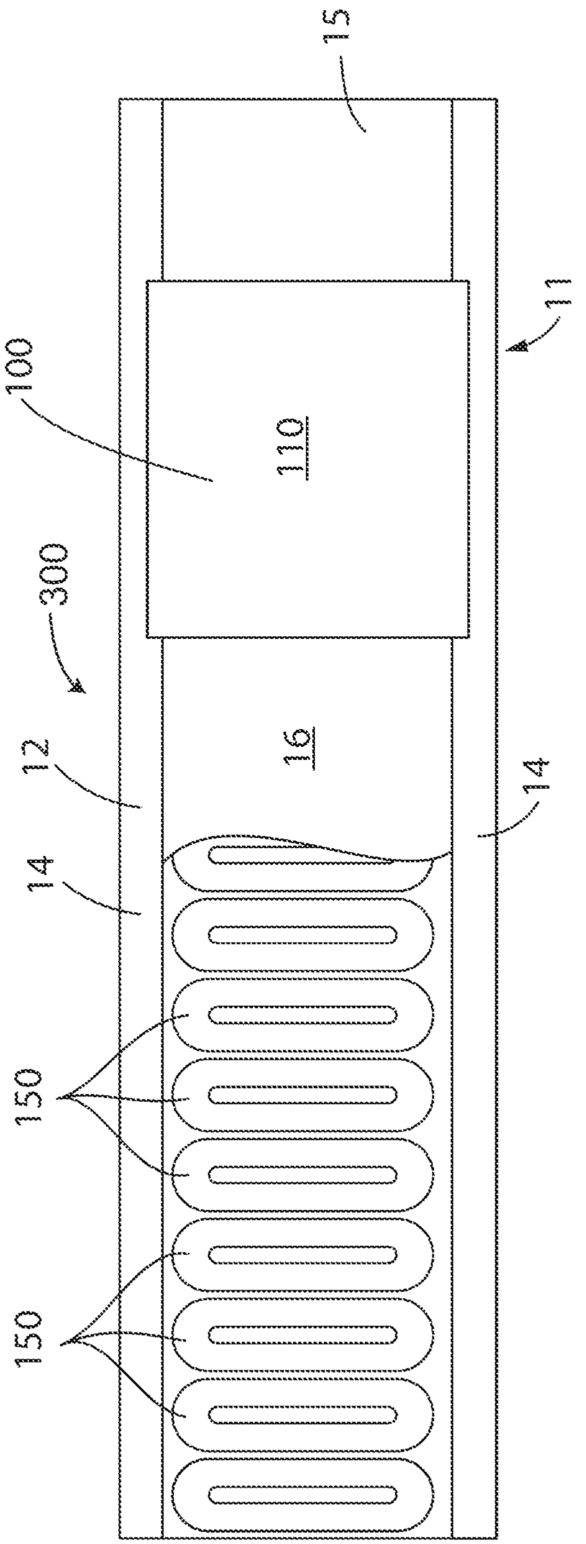
FIG. 7 is a partial top cutaway view of the mover and track segment of FIG. 2, according to some embodiments.

According to some embodiments, illustrated in FIGS. 5 and 6, the position feedback system utilizes the drive magnets 120 as position magnets. Position sensors 145 are positioned along the track segment 12 at a location suitable to detect the magnetic field generated by the drive magnets 120. According to the illustrated embodiment, the position sensors 145 are located below the coils 150. In some embodiments, the position sensors 145 may be interspersed with the coils 150 and located, for example, in the center of a coil or between adjacent coils. According to still another embodiment, the position sensors 145 may be positioned within the upper portion 17 of the track segment 12 and near the bottom surface 16 of the channel 15 to be aligned with the drive magnets 120 as each mover 100 travels along the tracks segment 12.

The segment controller 50 also includes a communication interface 56 that receives communications from the central controller 170 and/or from adjacent segment controllers 50. The communication interface 56 extracts data from the message packets on the industrial network and passes the data to a processor 52 executing in the segment controller 50. The processor may be a microprocessor. In some embodiments, the processor 52 and/or a memory device 54 within the segment controller 50 may be integrated on a field programmable gate array (FPGA) or an application specific integrated circuit (ASIC). It is contemplated that the processor 52 and memory device 54 may each be a single electronic device or formed from multiple devices. The memory device 54 may include volatile memory, non-volatile memory, or a combination thereof. The segment controller 50 receives the motion profile or desired motion of the movers 100 and utilizes the motion commands to control movers 100 along the track segment 12 controlled by that system controller 30.

Each segment controller 50 generates switching signals to generate a desired current and/or voltage at each coil 150 in the track segment 12 to achieve the desired motion of the movers 100. The switching signals 72 control operation of switching devices 74 for the segment controller 50. According to the illustrated embodiment, the segment controller 50 includes a dedicated gate driver module 70 which receives command signals from the processor 52, such as a desired voltage and/or current to be generated in each coil 150, and generates the switching signals 72. In some embodiments, the processor 52 may incorporate the functions of the gate driver module 70 and directly generate the switching signals 72. The switching devices 74 may be a solid-state device that is activated by the switching signal, including, but not limited to, transistors, thyristors, or silicon-controlled rectifiers.

According to the illustrated embodiment, the track receives power from a distributed DC voltage. A DC bus 20 receives a DC voltage, VDC, from a DC supply and conducts the DC voltage to each track segment 12. The illustrated DC bus 20 includes two voltage rails 22, 24 across which the DC voltage is present. The DC supply may include, for example, a rectifier front end configured to receive a single or multi phase AC voltage at an input and to convert the AC voltage to the DC voltage. It is contemplated that the rectifier section may be passive, including a diode bridge or, active, including, for example, transistors, thyristors, silicon-controlled rectifiers, or other controlled solid-state devices. Although illustrated external to the track segment 12, it is contemplated that the DC bus 20 would extend within the lower portion 19 of the track segment. Each track segment 12 includes connectors to which either the DC supply or another track segment may be connected such that the DC bus 20 may extend for the length of the track 10. In some embodiments, each track segment 12 may be configured to include a rectifier section (not shown) and receive an AC voltage input. The rectifier section in each track segment 12 may convert the AC voltage to a DC voltage utilized by the corresponding track segment.

The DC voltage from the DC bus 20 is provided at the input terminals 21, 23 to a power section for the segment controller. A first voltage potential is present at the first input terminal 21 and a second voltage potential is present at the second input terminal 23. The DC bus extends into the power section defining a positive rail 22 and a negative rail 24 within the segment controller. The terms positive and negative are used for reference herein and are not meant to be limiting. It is contemplated that the polarity of the DC voltage present between the input terminals 21, 23 may be negative, such that the potential on the negative rail 24 is greater than the potential on the positive rail 22. Each of the voltage rails 22, 24 are configured to conduct a DC voltage having a desired potential, according to application requirements. According to some embodiments, the positive rail 22 may have a DC voltage at a positive potential and the negative rail 24 may have a DC voltage at ground potential. In some embodiments, the positive rail 22 may have a DC voltage at ground potential and the negative rail 24 may have a DC voltage at a negative potential. According to some embodiments, the positive rail 22 may have a first DC voltage at a positive potential with respect to the ground potential and the negative rail 24 may have a second DC voltage at a negative potential with respect to the ground potential. The resulting DC voltage potential between the two rails 22, 24 is the difference between the potential present on the positive rail 22 and the negative rail 24.

It is further contemplated that the DC supply may include a third voltage rail 26 having a third voltage potential. According to some embodiments, the positive rail 22 has a positive voltage potential with respect to ground, the negative rail 24 has a negative voltage potential with respect to ground, and the third voltage rail 26 is maintained at a ground potential. In some embodiments, the negative voltage rail 24 may be at a ground potential, the positive voltage rail 22 may be at a first positive voltage potential with respect to ground, and the third voltage rail 26 may be at a second positive voltage potential with respect to ground, where the second positive voltage potential is approximately one half the magnitude of the first positive voltage potential. With such a split voltage DC bus, two of the switching devices 74 may be used in pairs to control operation of one coil 150 by alternately provide positive or negative voltages to one the coils 150.

The power section in each segment controller 50 may include multiple legs, where each leg is connected in parallel between the positive rail 22 and the negative rail 24. According to the illustrated embodiment, three legs are shown. However, the number of legs may vary and will correspond to the number of coils 150 extending along the track segment 12. Each leg includes a first switching device 74 *a* and a second switching device 74 *b* connected in series between the positive rail 22 and the negative rail 24 with a common connection 75 between the first and second switching devices 74 *a*, 74 *b*. The first switching device 74 *a* in each leg 221 may also be referred to herein as an upper switch, and the second switching device 74 *b* in each leg 221 may also be referred to herein as a lower switch. The terms upper and lower are relational only with respect to the schematic representation and are not intended to denote any particular physical relationship between the first and second switching devices 74 *a*, 74 *b*. The switching devices 74 include, for example, power semiconductor devices such as transistors, thyristors, and silicon controlled rectifiers, which receive the switching signals 72 to turn on and/or off. Each of switching devices may further include a diode connected in a reverse parallel manner between the common connection 75 and either the positive or negative rail 22, 24.

The processor 52 also receives feedback signals from sensors providing an indication of the operating conditions within the power segment or of the operating conditions of a coil 150 connected to the power segment. According to the illustrated embodiment, the power segment includes a voltage sensor 62 and a current sensor 60 at the input of the power segment. The voltage sensor 62 generates a voltage feedback signal and the current sensor 60 generates a current feedback signal, where each feedback signal corresponds to the operating conditions on the positive rail 22. The segment controller 50 also receives feedback signals corresponding to the operation of coils 150 connected to the power segment. A voltage sensor 153 and a current sensor 151 are connected in series with the coils 150 at each output of the power section. The voltage sensor 153 generates a voltage feedback signal and the current sensor 151 generates a current feedback signal, where each feedback signal corresponds to the operating condition of the corresponding coil 150. The processor 52 executes a program stored on the memory device 54 to regulate the current and/or voltage supplied to each coil and the processor 52 and/or gate driver module 70 generates switching signals 72 which selectively enable/disable each of the switching devices 74 to achieve the desired current and/or voltage in each coil 150. The energized coils 150 create an electromagnetic field that interacts with the drive magnets 120 on each mover 100 to control motion of the movers 100 along the track segment 12.

In operation, the load may vary on a mover 100 as the mover travels along the track. As previously discussed, the mover 100 includes a platform 110 secured to the top surface 104 of the body 102 of the mover 100. It is contemplated that platforms or attachments of various shapes may be secured to the top surface 104 of the body 102. Further, various workpieces, clips, fixtures, and the like may be mounted on the top of each platform 110 for engagement with a product to be carried along the track by the mover 100. The platform 110 and any workpiece, clip, fixture, or other attachment present on the platform may define, at least in part, a load present on the mover 100. For a given system, each mover 100 may have the same platform and/or attachments to uniformly interact with identical product being loaded on and off the mover 100. The product may constitute an additional load and may vary at different locations along a track. For example, a mover 100 may initially have no additional load present. At a first station, a container, such as a box, bottle, or the like may be loaded on to the mover 100. At a second station, product may be partially or fully loaded into the container. At additional stations, steps, such as additional loading, closing, labeling, and the like may be taken that further alter the load present on each mover. At a final station, the load may be removed and the mover 100 returns to the initial station. According to the exemplary application, the load varies along each section of track after additional packaging and/or product is placed on the mover 100. In addition, wear or damage on contacting surfaces, bearings, and the like may cause variations in the loading between movers 100 or variations in loading for a single mover over time.

In order to optimize performance of the linear drive system 300, it is desirable to characterize loads present on the movers 100 at various locations along the track. According to some embodiments, the segment controller 50 may be configured to provide a characterization of a load present on each mover 100 as it travels along the corresponding track segment 12. The mover 100 is initially positioned at a point of interest along a track segment 12. The expected load to be present on the mover 100 may also be included on the mover. For example, if a container and/or product is present on the mover 100 during operation, an appropriate container and/or product may be loaded on the mover 100 prior to characterization. As will be discussed in more detail below, the segment controller 50 then executes a characterization module to obtain a frequency response corresponding to performance of a mover 100 at a location and with an expected load. In some embodiments, the segment controller 50 may sample data and transmit stored data to the central controller 170 or to another remote processing device to obtain the frequency response corresponding to performance of the mover 100 at a location and with an expected load.

Figure 9:
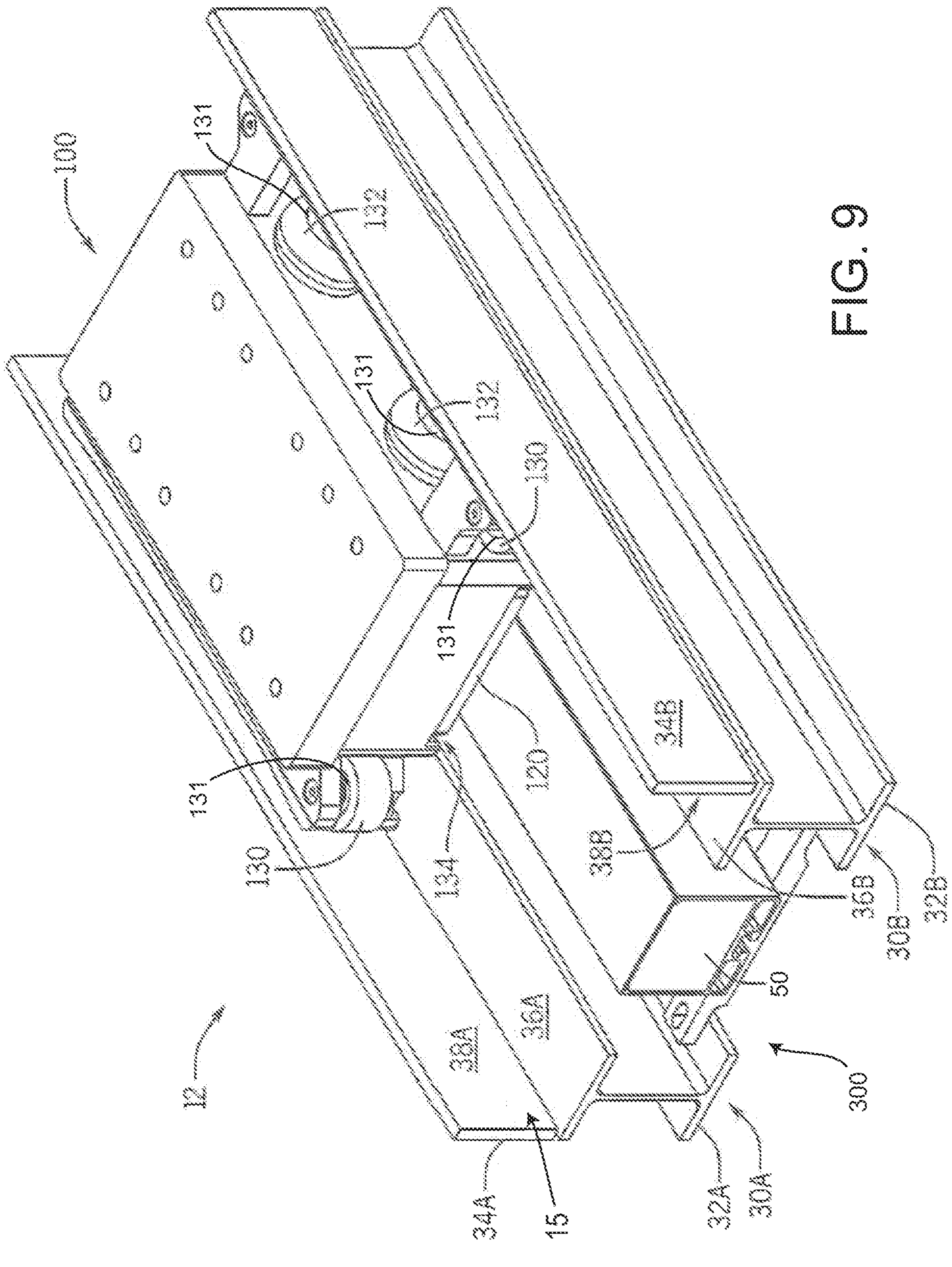
FIG. 9 is a perspective view of a mover for the linear drive system of FIG. 1, according to some embodiments.

Referring to FIG. 9, the mover 100 may include wheels 130, 132 configured to roll along one or more surfaces (e.g., both a horizontal surface and a vertical surface). For example, a first set of wheels 130 may mounted horizontally and configured to engage inner, vertical surfaces 38A and 38B of rails 30A and 30B of the track segments 12 (e.g., on guiding segments 34A and 34B of rails 30A and 30B). A second set of wheels 132 may be mounted vertically and configured to engage inner, horizontal surfaces 36A and 36B of each of the rails 30A and 30B. In some embodiments, the two sets of wheels 132 are used to align the mover 100 within the channel 15 of the track segment 12 as the mover 100 travels along the track 10. In some embodiments, only one set of wheels 132 are used to facilitate transportation of the mover 100 along the track 10. In some embodiments, the wheels 132 and 130 each include a corresponding bearing 131 that is configured to facilitate improved rotation of the wheels 132 and 130.

Referring to FIGS. 1-9, the track 10, the linear drive system 300, a control system for the linear drive system 300, any of the movers 100 of the linear drive system 300, or any diagnostic techniques for the linear drive system 300 may be the same as or similar to U.S. application Ser. No. 15/702,983, now U.S. Pat. No. 11,165,372 B2, U.S. application Ser. No. 15/710,977, now U.S. Pat. No. 10,442,637 B2, U.S. application Ser. No. 16/015,699, now U.S. Pat. No. 10,432,117 B1, U.S. application Ser. No. 15/701,578, now U.S. Pat. No. 10,562,715 B2, and/or U.S. application Ser. No. 17/355,714, the entire disclosures of all of which are incorporated by reference herein.

Diagnostic System

Overview

Figure 10:
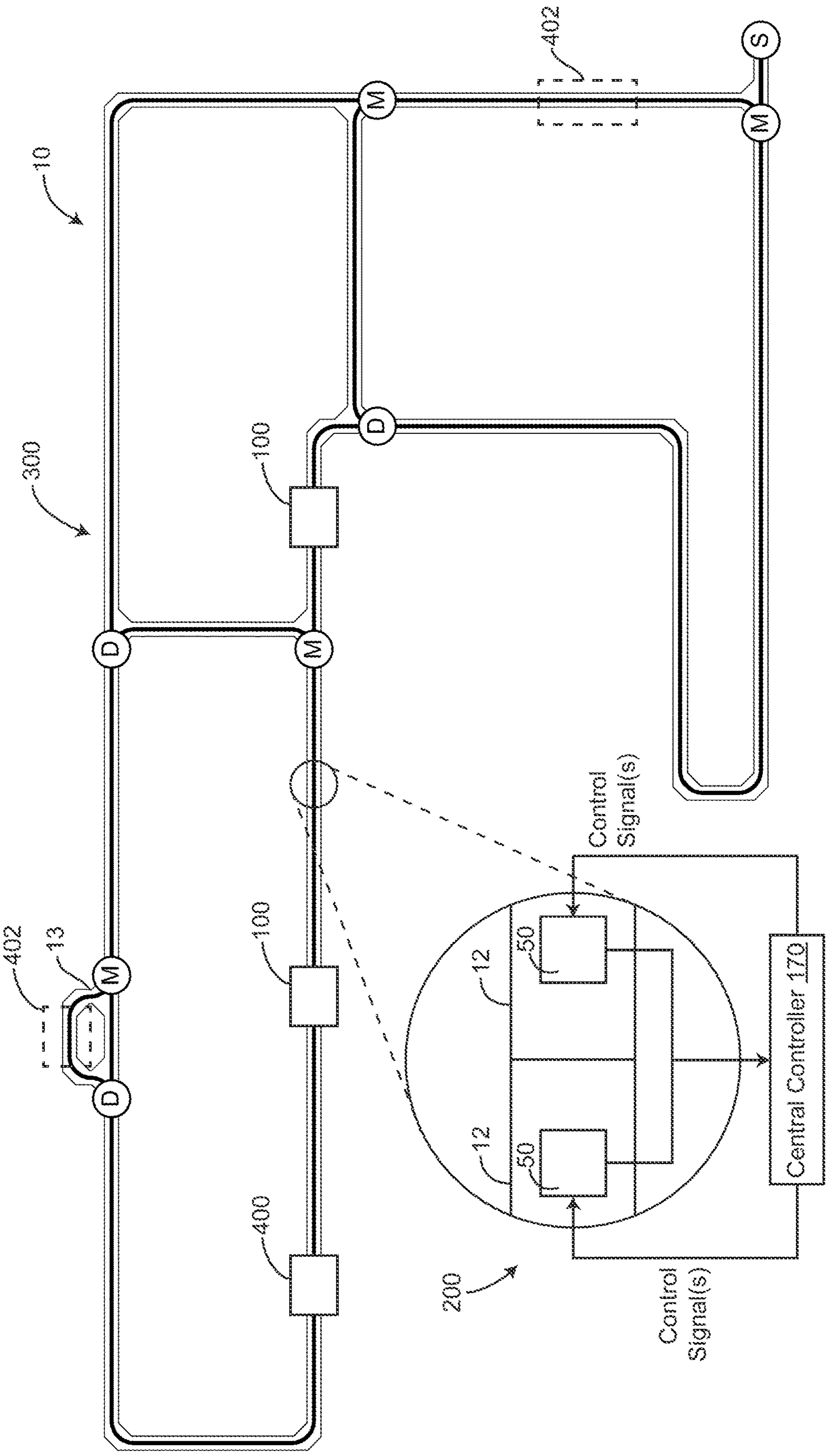
FIG. 10 is a diagram illustrating a diagnostics system for the linear drive system of FIG. 1, according to some embodiments.

Referring to FIG. 10, a fault detection system 200 for the linear drive system 300 includes the track 10, one or more movers 100, an inspection mover 400 (e.g., an inspection vehicle, one of the movers 100 with calibrated equipment), and an inspection station 402, according to some embodiments. In some embodiments, the inspection station 402 is one of the track segments 12 and has similar structure as the other track segments 12. The inspection station 402 may be a calibrated track segment 12 that has calibrated sensors (e.g., calibrated sensors 145), calibrated coils 150, a functional segment controllers 50, a calibrated gate driver module 70, etc. In some embodiments, the inspection mover 400 is one of the movers 100 with calibrated drive magnets 120, calibrated surfaces (e.g., physical geometry), calibrated position magnets 140, functional bearings 121, etc. In some embodiments, the inspection station 402 also includes geometry (e.g., track geometry) that is confirmed to be in-spec (e.g., free of obstructions, free of excessive wear, appropriate dimensions that are within specification, free from scratches, dents, etc.).

The inspection station 402 may be provided on a bypass track 13 so that target or tested movers 100 can be transported and moved off a path of the track for testing. In some embodiments, the inspection station 402 is a specific portion of the track 10 that is not a bypass so that movers 100 can be tested as the movers 100 are induced to travel along the path of the track 10.

The central controller 170 is configured to operate the segments controllers 50 of the linear drive system 300 to energize the drive coils 150 to transport the movers 100 along the inspection station 402 (e.g., according to a test waveform or profiles of the drive coils 150) to identify and diagnose one or more faults of the movers 100 (e.g., perform a mover test), according to some embodiments. In some embodiments, the central controller 170 is configured to operate the segment controllers 50 to energize the drive coils 150 so that the inspection mover 400 travels along one or more portions of the track 10, or a specific portion of the track 10 to identify faults of the one or more portions of the track or the specific portion of the track. Advantageously, the inspection station 402 provides a reference or baseline data source that can be used to identify faults of the movers 100 (e.g., a presence of a fault and/or a type of the fault), and the inspection mover 400 provides a reference or baseline data source that can be used to identify faults of one or more of the track segments 11. In this way, the inspection station 402 enables the central controller 170 to cause conduction of a mover test, and the inspection mover 400 enables the central controller 170 to cause conduction of a track test.

System Architecture

Figure 11:
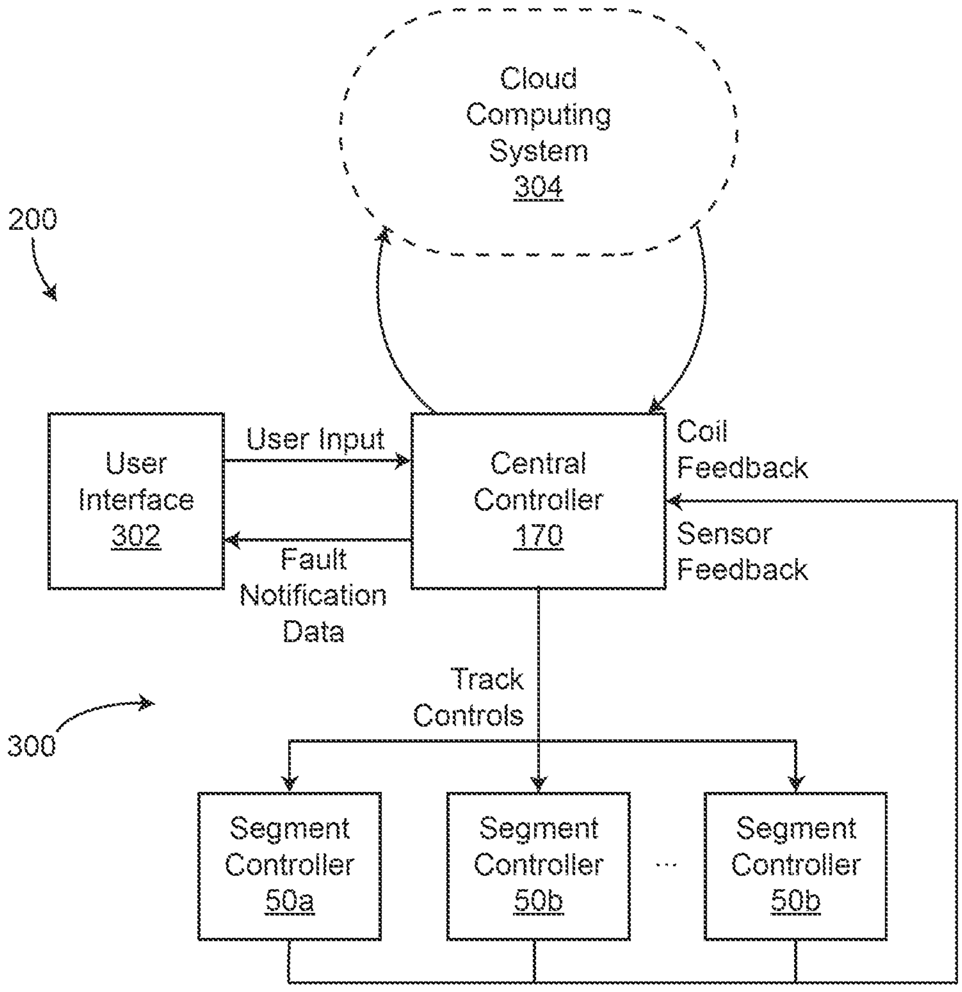
FIG. 11 is a block diagram of a control system of the diagnostics system of FIG. 10, according to some embodiments.

Referring to FIG. 11, the fault detection system 200 includes the central controller 170, a user interface 302, a cloud computing system 304, and the linear drive system 300. The central controller 170 may receive a user input from the user interface 302 that includes a request to perform a specific test (e.g., a track test of a particular track segment, a track test across multiple track segments, a mover test of a specific mover, a mover test of one or more movers, etc.). The central controller 170 can also receive one or more measured values of the inspection station 402 or the inspection mover 400 for use in predicting an expected response when performing the track test or the mover test. The central controller 170 may provide track controls (e.g., commanded operation, control signals, commanded control parameters, commanded current, sequence of activation of the drive coils 150, wave forms to use for the drive coils 150, steps of the track test or the mover test, etc.) to the segment controllers

50. The segment controller 50 use the track controls to perform or conduct the track test or the mover test by activating the drive coils 150 according to the track controls provided by the central controller 170. The central controller 170 is configured to receive feedback from the linear drive system 300 (e.g., from the segment controllers) while performing the track test or the mover test. The feedback may be received from the segment controllers 50, the sensors 145, etc. The feedback can include coil feedback (e.g., actual current in the drive coils 150) and sensor feedback (e.g., the signals generated by the sensors 145 responsive to travel of the movers 100 and/or the inspection mover 400 along the track 10). The central controller 170 is configured to analyze, assess, etc., the feedback provided by the segment controllers 50 to determine a fault of one or more of the track segments 11, or one or more movers 100. For example, the central controller 170 can use the feedback provided by the segment controllers 50 from the inspection station 402 while performing the mover test to determine a fault of the mover 100 that is at the station (e.g., based on the response of the mover 100 as indicated by the feedback provided by the segment controllers 50). The central controller 170 is similarly configured to use the feedback provided by the segment controllers 50 of one or more portions of the track 10 (e.g., target or tested portions or segments 11 of the track 10) as the inspection mover 400 travels across the one or more portions of the track 10 to perform the track test and to determine a fault of the one or more portions of the track 10.

The central controller 170 is configured to identify a track fault or a mover fault, and provide fault notification data to the user interface 302. The user interface 302 can be configured to present the fault notification to a user, technician, administrator, system owner, etc. In some embodiments, the central controller 170 also determines a type or cause of the track fault or the mover fault and provides the type or cause to the user interface 302 as part of the fault notification data. In some embodiments, the central controller 170 determines a list of potential types or causes of the track fault or the mover fault and provides the list to the user interface 302 as part of the notification data. In some embodiments, the central controller 170 is configured to prompt the operator, user, or technician to manually repair or initiate a maintenance action for one of the tested movers 100 or the track segments 11.

In some embodiments, the central controller 170 is in communication with a cloud computing system 304 (e.g., a server, a distributed network system, etc.). In some embodiments, one or more of the processes of the central controller 170 as described herein (e.g., neural network or machine learning techniques, modeling techniques, predictive techniques, etc.) are performed on or at least partially by the cloud computing system 304. The cloud computing system 304 is also configured to store database data and provide access to the database data by the central controller 170 such that the central controller 170 can access any historical data (e.g., sensor feedback, coil feedback, track controls, etc.) for any of the movers 100 of the linear drive system 300.

Fault Detection Controller

Figure 12:
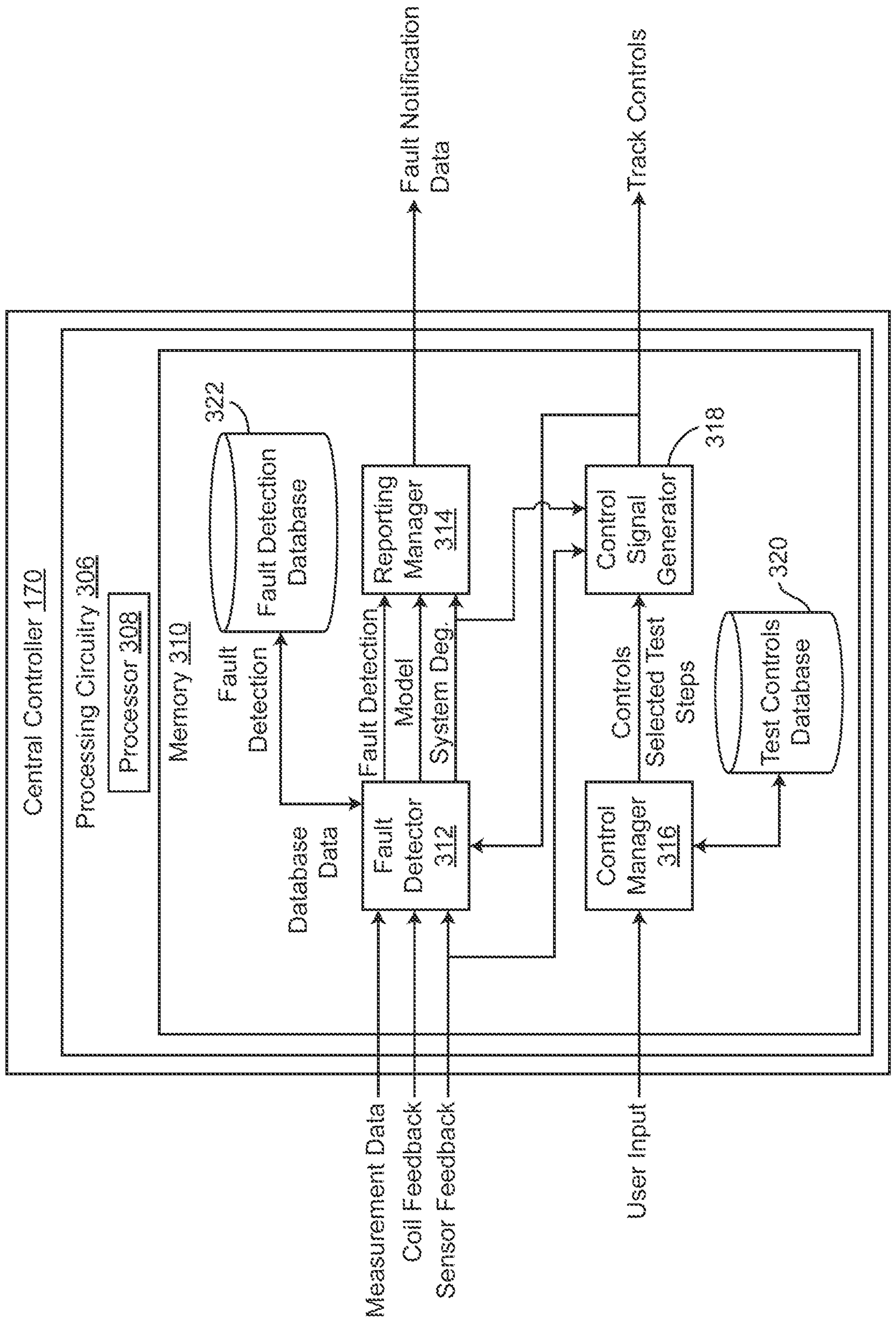
FIG. 12 is a block diagram of a controller of the control system of FIG. 11, according to some embodiments.

Referring to FIG. 12, the central controller 170 is shown in greater detail, according to some embodiments. In some embodiments, the central controller 170 is configured to determine high level commands (e.g., track controls) for the linear drive system 300 and provide the track controls to the segment controllers 50. The central controller 170 may be configured to orchestrate or initiate one or more track tests, mover tests, etc., and determine faults of the track segments 11, the movers 100, etc., based on comparisons between actual feedback (e.g., sensor feedback, coil feedback, etc.) while performing the track tests or mover tests, and predicted or expected feedback given characteristics of the inspection mover 400 or the inspection station 402.

As shown in FIG. 12, the central controller 170 includes processing circuitry 306, a processor 308, and memory 310. Processing circuitry 306 can be communicably connected to a communications interface such that processing circuitry 306 and the various components thereof can send and receive data via the communications interface. Processor 308 can be implemented as a general purpose processor, an application specific integrated circuit (ASIC), one or more field programmable gate arrays (FPGAs), a group of processing components, or other suitable electronic processing components.

Memory 310 (e.g., memory, memory unit, storage device, etc.) can include one or more devices (e.g., RAM, ROM, Flash memory, hard disk storage, etc.) for storing data and/or computer code for completing or facilitating the various processes, layers and modules described in the present application. Memory 310 can be or include volatile memory or non-volatile memory. Memory 310 can include database components, object code components, script components, or any other type of information structure for supporting the various activities and information structures described in the present application. According to some embodiments, memory 310 is communicably connected to processor 308 via processing circuitry 306 and includes computer code for executing (e.g., by processing circuitry 306 and/or processor 308) one or more processes described herein.

In some embodiments, central controller 170 is implemented within a single computer (e.g., one server, one housing, etc.). In various other embodiments central controller 170 can be distributed across multiple servers or computers (e.g., that can exist in distributed locations) such as on processing circuitry of the cloud computing system 304.

Referring still to FIG. 12, the memory 310 includes a fault detector 312, a reporting manager 314, a control manager 316, a control signal generator 318, a test controls database 320, and a fault detection database 322, according to some embodiments. In some embodiments, the fault detector 312 is configured to obtain feedback from the segment controllers 50 (e.g., sensor feedback and coil feedback) and determine or identify the track fault or the mover fault. In some embodiments, the fault detector 312 is configured to access the fault detection database 322 to use aggregated or historical data for training a neural network or for making a prediction (e.g., to identify patterns in the sensor feedback or coil feedback that match corresponding patterns in the fault detection database 322 for known faults). In some embodiments, the fault detector 312 is also configured to write new entries to the fault detection database 322, shown as fault detection. The new entries can include the identified fault detection (e.g., the type) as well as the corresponding sensor feedback and coil feedback, and one or more characteristics of the inspection station 402 or the inspection mover 400 (e.g., measurement data) that are used by the fault detector 312 (e.g., correlated with the fault) to determine, identify, or predict the fault. The fault detector 312 can also obtain the track controls from the control signal generator 318 and use the track controls (e.g., commanded currents of the drive coils 150) as inputs for determining, identifying, or detecting the fault.

The fault detector 312 may output the fault detection to the reporting manager 314, a model to the reporting manager, and an estimated system degradation to the reporting manager. In some embodiments, the fault detector 312 is also configured to perform various modeling or predictive techniques as described in greater detail below. The reporting manager is configured to obtain the fault detection, the model, and/or the system degradation, and generate and output display data for the user interface 302, shown as fault notification data. The fault notification data may include one or more predictions of the model (e.g., a model of one of the movers 100, the inspection station 402, the inspection mover 400, etc.), the estimated system degradation, identification of a suspect track segment 11 or suspect mover 100, test results (e.g., results of the track test or the mover test), the type or cause of the fault, where the fault is detected (e.g., which mover 100 or which track segment 11 is faulty), etc. The fault detector 312 can also provide the estimated system degradation to the control signal generator 318 for use in adjusting track controls to account for the estimated system degradation, according to some embodiments.

In some embodiments, the control manager 316 is configured to receive the user input from the user interface 302 (e.g., a request to perform the track test or a request to perform the mover test) and access the test controls database 320. The test controls database 320 may represent a memory unit or database that stores various test steps for different tests (e.g., for the track test, the mover test at the inspection station 402, etc.). In some embodiments, the control manager 316 is configured to also use sensor feedback to determine the position of a target or to-be-tested mover 100 so that the control manager 316 can determine controls to operate the mover 100 to transport to the inspection station 402. Similarly, the control manager 316 may receive sensor feedback to track or identify the position of the inspection mover 400 so that the control manager 316 can determine controls to transport the inspection mover 400 to a target or to-be-tested track segment 11. The control manager 316 may output controls or selected test steps to the control signal generator 318 for use in determining track controls.

The control signal generator 318 is configured to receive the controls or selected test steps from the control manager 316 and the system degradation from the fault detector 312, and determine track controls for the segment controllers 50, according to some embodiments. In some embodiments, the control signal generator 318 also provides the track controls to the fault detector 312 for use in determining, predicting, or detecting the fault. The control signal generator 318 is configured to perform closed-loop control of the movers 100 by generating control signals (e.g., track controls) while obtaining and using the sensor feedback. The control signal generator 318 may use automatic calibration based on results from the fault detector 312, use baseline performance and measurements of the linear drive system 300, use a full sensor map with gain and offset calibration data, use a friction map of the linear drive system 300, vertical gap and thrust constants, expected or measured motor to motor gaps, track curvature, control parameter settings, magnet array strength and assembly of the movers 100, vehicle bearing and assembly, and mover identification techniques in order to perform the closed-loop control. In some embodiments, the closed-loop control of the control signal generator 318 is performed at least partially at the segment controllers 50.

When the user input includes a requested test (e.g., a request to test a particular track segment, a request to test a particular mover, etc.), the control manager 316 is configured to communicate with the test control database 320 to select steps for the track test or the mover test, according to some embodiments. The control manager 316 may select steps and controls for the mover 100 to be tested so that the mover 100 is driven to transport to the inspection station 402, and so that the track segments 11 of the inspection station command operation of the mover 100 according to a mover test profile. Similarly, the control manager 316 may select steps and controls for the track segments 11 to be tested, and command operation of the inspection mover 400 to and along the track segments 11 to be tested according to a test profile (e.g., a test sequential activation of the drive coils 150 of the track segments 11 to be tested). In some embodiments, the fault detector 312 is configured to obtain the sensor feedback, the coil feedback, and the track controls while the track test or the mover test are performed. The fault detector 312 can collect, analyze, and assess the sensor feedback, the coil feedback, and the track controls in order to detect a fault of the track (e.g., while performing the track test) or a fault of the mover (e.g., while performing the mover test).

Fault Detector

Figure 13:
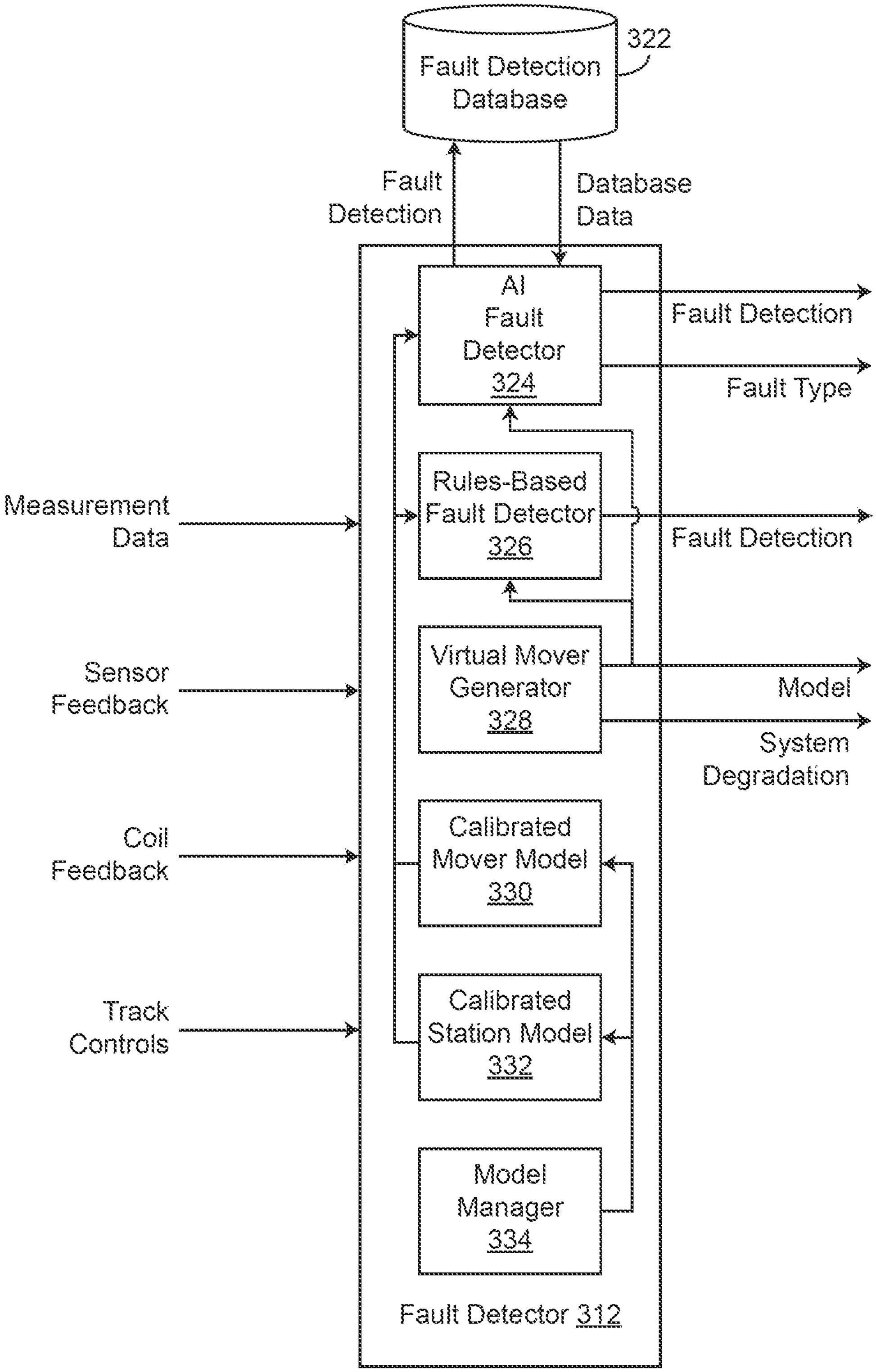
FIG. 13 is a block diagram of a fault detector of the controller of FIG. 12, according to some embodiments.

Referring particularly to FIG. 13, the fault detector 312 is shown in greater detail, according to some embodiments. In some embodiments, the fault detector 312 includes an artificial intelligence ("AI") fault detector 324, a rules-based fault detector 326, a virtual mover generator 328, a calibrated mover model 330, a calibrated station model 332, and a model manager 334. In some embodiments, the AI fault detector 324, the rules-based fault detector 326, the virtual mover generator 328, the calibrated mover model 330, the calibrated station model 332, and the model manager 334 are all configured to receive the measurement data, the sensor feedback, the coil feedback, and the track controls. In some embodiments, the fault detector 312 is configured to collect, aggregate, analyze, assess, etc., the sensor feedback and coil feedback obtained while the control manager 316 and the control signal generator 318 perform closed loop control of the linear drive system 300 or control the drive coils 150 such that various tests (e.g., a mover test, a track test, a repair function, etc.) are performed.

The measurement data may include any measured characteristic of the inspection mover 400 or the inspection station 402. For example, the measurement data may include a measured strength of the magnets 120 and/or position magnets 140 of the inspection mover 400, a measured gap width between a bottom surface of the inspection mover 400 and the track 10 (e.g., calibrated vertical gaps), a measured value of the payload of the inspection mover 400 (e.g., a weight of the inspection mover 400), a measured drag of wheels of the inspection mover 400 to indicate if the bearings are clogged or not, etc. In some embodiments, the measurement data indicates that the inspection mover 400 has a calibrated magnet array, calibrated bearings/wheels, calibrated vertical gaps, and a calibrated payload. The measurement data may also include measurement of one or more sensors 145 of the inspection station 402, measurement of the drive coils 150 of the inspection station 402, measurement of the gate driver module 70, or measurement of the physical geometry of the track segments 12 of the inspection station 402.

In some embodiments, the measurement data is obtained by one or more measurement devices (e.g., sensors) separate from the sensors of the linear drive system 300 and/or sensors of the linear drive system 300 that are known to be accurate. The fault detector 312 can use the measurement data to define a set of known characteristics of the inspection mover 400 and/or the inspection station 402. As such, the inspection mover 400 and the inspection station 402 may be referred to as a "calibrated inspection mover" and a "calibrated inspection station," respectively. In this context, "calibrated" means that the inspection mover 400 and the inspection station 402 have known characteristics (i.e., the characteristics defined by the measurement data) and thus can be expected to behave in a known or predictable manner during the testing processes described herein.

Advantageously, using the measurement data to define the "calibrated" characteristics of the inspection mover 400 and the inspection station 402 allows the fault detector 312 to eliminate unknown variables during the testing processes and isolate the source of a fault. For example, consider a scenario in which one of the movers 100 is moving along a segment 12 of the track 10 more slowly than expected. This indicates a fault in the linear drive system 300, but the source of the fault could be any of a variety of issues. For example, the fault may exist in the segment 12 of the track 10 (e.g., debris buildup in the segment 12, faulty drive coils 150 in the segment 12, etc.) or the fault may exist in the mover (e.g., mover bearing wear, degraded mover magnet array, etc.). Thus, it can be difficult to determine the cause of the fault when there are unknown variables or characteristics in both the movers 100 and the segments 12 of the track 10.

The systems and methods described herein provide a solution to this problem by eliminating the unknown variables in the inspection mover 400 and the inspection station 402. Accordingly, the inspection mover 400 can be used to detect faults in the segments 12 of the track 10 by predicting the expected behavior (e.g., movement speed, position, etc.) of the inspection mover 400 along a tested track segment 12 based on the known or "calibrated" characteristics of the inspection mover 400 and a baseline assumption that the tested track segment 12 is non-faulty. If the actual behavior of the inspection mover 400 differs from the expected behavior along the tested track segment 12, the fault detector 312 can conclude that a fault exists in the tested track segment 12. Similarly, the inspection station 402 can be used to detect faults in the movers 100 by predicting the expected behavior (e.g., movement speed, position, etc.) of a tested mover 100 along the inspection station 402 based on the known or "calibrated" characteristics of the inspection station 402 and a baseline assumption that the tested mover 100 is non-faulty. If the actual behavior of the tested mover 100 differs from the expected behavior along the inspection station 402, the fault detector 312 can conclude that a fault exists in the tested mover 100.

The sensor feedback may include signals (e.g., voltage, current, etc.) that is generated by and provided by the position sensors 145 responsive to movement of the position magnets 140 as the movers 100 travel along the track 10. In some embodiments, the sensor feedback is provided by the segment controllers 50 through the feedback circuit 58. The sensor feedback can also be used for control and sequential energization of the drive coils 150. The sensor feedback may be a signal and may include amplitude and shape such that the central controller 170 can use the sensor amplitude and shape to identify faults.

The coil feedback may include a magnitude of current or voltage that is provided through the drive coils 150 to drive the movers 100. In some embodiments, the coil feedback is a measured value. In some embodiments, the coil feedback is an actual current that is provided through the drive coils 150 to induce motion of the movers 100 (e.g., to induce motion of a tested one of the movers 100). In some embodiments, the coil feedback differs from a commanded current, in that the coil feedback indicates actual electrical current in the coils 150 (e.g., in each of the coils 150).

The track controls may include a commanded current for the drive coils 150, as well as a sequential control or coil activation scheme. For example, the track controls may include a sequence of which of the drive coils 150 to activate, as well as a current to command through the drive coils 150, and/or a waveform profile of signals for each of the drive coils 150.

Referring still to FIG. 13, the rules-based fault detector 326 may be configured to collect, analyze, and assess the measurement data, the sensor feedback, the coil feedback, and the track controls in a rules-based detection process to identify faults of the movers 100 at the inspection station 402 or identify faults of the track segments 11 as the inspection mover 400 travels along the track segments 11. In some embodiments, the rules-based fault detector 326 is configured to obtain a parameter of (a) the mover 100 that is being tested at the inspection station 402 while performing a test movement, or (b) the track segment 11 as the inspection mover 400 travels along the track segment 11. In some embodiments, the parameter is a portion of the sensor feedback or the coil feedback (e.g., the commanded current, the actual current in the drive coils 150, etc.). In some embodiments, the parameter is determined based on the sensor feedback, the coil feedback, the track controls and/or the measurement data.

The rules-based fault detector 326 is configured to use the parameter, or one or more different parameters, and compare the parameter or one or more different parameters to corresponding thresholds, according to some embodiments. In some embodiments, the rules-based fault detector 326 is configured to determine a fault of the track segment 11 or the mover 100 based on the parameter of the track segment 11 or the mover 100 being greater than, less than, or deviating a certain amount from, the threshold. In some embodiments, the thresholds is/are a static threshold (e.g., a static threshold value of an actual current). In some embodiments, the thresholds is/are determined by the calibrated station model 332 and the calibrated mover model 330 based on the measurement data, the sensor feedback, the coil feedback, and the track controls. In some embodiments, the thresholds is/are predicted responses or values of the parameters given the track controls and calibration of the inspection mover 400 or the inspection station 402 (e.g., the measurement data).

In some embodiments, the rules-based fault detector 326 is configured to detect faults of one of the movers 100 at the inspection station 402. For example, the rules-based fault detector 326 may observe a response of the mover 100 at the inspection station 402 while the mover 100 is commanded according to a test profile (e.g., commanded to move a particular distance or speed by sequential energization of the drive coils 150 of the inspection station 402), compare the response to a predicted or expected response (e.g., predicted using a model, an assumed response for properly functioning movers 100), and determine a fault of the mover 100 in response to the response deviating from the predicted or expected response.

In some embodiments, the rules-based fault detector 326 is configured to detect faults of one or more track segments 11 as the inspection mover 400 travels along the track segments 11. In some embodiments, the rules-based detector is configured to compare sensor amplitude and shape (e.g., a characteristic of the sensor signal provided as the sensor feedback) to a corresponding profile to identify one or more sensors of the track segments 11 that are defective as the inspection mover 400 travels along the track 10 (e.g., a sensor fault). In some embodiments, defective sensors can be marked and skipped when performing closed-loop feedback control to induce travel of the movers 100. In some embodiments, the rules-based fault detector 326 is configured to identify a coil defect or a coil fault by comparing the coil feedback (e.g., the actual current in the coil) to a coil threshold or an expected coil current given motion of the inspection mover 400. If the coil feedback (e.g., the actual current in the coil) deviates from the coil threshold or the expected coil current (e.g., exceeds the expected current indicating that excessive current is required to induce motion of the inspection mover 400), the rules-based fault detector 326 may determine that the drive coil 150 that has the unexpected coil feedback is faulty or defective (e.g., a coil fault). In some embodiments, the rules-based fault detector 326 is configured to compare the commanded current of the drive coil 150 (e.g., as provided with the track controls) to the actual current in the drive coil 150, and determine that the drive coil 150 is defective in response to the actual current deviating from the commanded current.

In some embodiments, the rules-based fault detector 326 is configured to determine or obtain, based on the sensor feedback, tracking or position of the inspection mover 400 along the track segments 11 that are currently being tested. In some embodiments, the rules-based fault detector 326 can determine a tracking error between the position of the inspection mover 400 along the track segments 11 that are currently being tested by comparing the position of the inspection mover 400 to an expected position of the inspection mover 400 given the track controls. In some embodiments, the expected position is a predicted or estimated position of the inspection mover 400 based on a predictive model (e.g., the calibrated mover model 330). If the tracking error exceeds a threshold (e.g., the position deviates from the expected position by an amount), the rules-based fault detector 326 may determine that a track fault is present (e.g., that a bearing of the track segments 11 is worn, that an obstruction is present on the track segments 11, etc.) that causes the deviation of the expected position from the predicted position.

In some embodiments, the rules-based fault detector 326 is also configured to use the track controls (e.g., the commanded current) to determine if an obstruction is present on one or more of the track segments 11. For example, the rules-based fault detector 326 may monitor the commanded current provided as the track controls, and, if the commanded current exceeds an expected or predicted value required to induce motion of the inspection mover 400, determine that an obstruction is present on the track segments 11 or that a bearing of the track segments 11 has worn, thereby causing increased commanded current to induce motion of the inspection mover.

Referring still to FIG. 13, the rules-based fault detector 326 may also determine one or more mover faults by observing and analyzing the sensor feedback, coil feedback, and track controls while the mover test is performed. In some embodiments, the rules-based fault detector 326 is configured to detect faults of one of the movers 100 that is undergoing a test at the inspection station 402. In some embodiments, the mover 100 is commanded at the inspection station 402 according to a test waveform. The rules-based fault detector 326 can obtain the sensor feedback and, similarly as described above, identify a tracking error between a predicted position of the mover 100 and an actual position of the mover 100 (e.g., a position of the mover 100, a speed of the mover 100, a rate of change of the position of the mover 100, etc.). The rules-based fault detector 326 can identify a bearing fault or a magnet fault due to the tracking error exceeding a threshold. In some embodiments, the rules-based fault detector 326 is configured to identify a bearing fault (e.g., bearing wear) of the mover 100 responsive to identifying that the commanded current required to induce motion of the mover 100 exceeds an expected or predicted commanded current. In some embodiments, the rules-based fault detector 326 is configured to determine if the magnet array has a decreased strength by identifying deviation between the actual response or movement of the mover 100 when the drive coils 150 are energized according to a test waveform and a predicted response or movement of the mover 100 (e.g., as predicted by a model, or a static expected response). In some embodiments, the rules-based fault detector 326 is configured to output the fault detection indicating a track fault or a mover fault such that the user is informed regarding the results of the track test or the mover test.

Referring still to FIG. 13, the AI fault detector 324 may be configured to use machine learning, artificial intelligence, or a neural network technique to identify the fault detection (e.g., the track fault or the mover fault), according to some embodiments. In some embodiments, the AI fault detector 324 uses a neural network (e.g., a convolutional neural network, a generative adversarial neural network, etc.) that is trained based on the fault detection data of the fault detection database 322. The data of the fault detection database 322 can include series of measurement data, sensor feedback, coil feedback, and track controls, and a corresponding fault of the mover 100 that is being tested or the track segments. In some embodiments, the fault information in the fault detection database 322 is confirmed by a user or operator that conducts a manual diagnosis and manually enters (e.g., via the user interface 302) the cause of the fault. In this way, the fault detection database 322 can include aggregated data of various causes of track faults and mover faults (e.g., mover bearing wear fault, coil faults, sensor faults, magnetic array faults, track bearing wear faults, etc.). In some embodiments, the AI fault detector 324 uses the data of the fault detection database 322 (e.g., the sensor feedback and the coil feedback for corresponding track controls for either the track test or the mover test and the corresponding cause of the fault) to train the neural network and to predict both the fault and the type or cause of the fault.

For example, the AI fault detector 324 may include a first model or neural network that predicts a track fault and the cause or type of the fault (e.g., the fault type) for track tests, and a second model or neural network that predicts mover faults and the cause or type of the fault (e.g., the fault type) for mover tests. In some embodiments, the AI fault detector 324 uses the first neural network by providing the sensor feedback, the coil feedback, and the track controls collected over a track test (e.g., while the inspection mover 400 travels over one or more track segments 11 to be tested) to the first neural network as inputs, and obtains fault detection and fault type as output (e.g., coil fault, defective sensor, debris on track, etc.). In some embodiments, the AI fault detector 324 is similarly configured to use the second neural network by providing the sensor feedback, the coil feedback, and the track controls collected over a mover test (e.g., while the mover 100 to be tested travels over the inspection station 402) as inputs to the second neural network, and obtains fault detection and fault type as outputs (e.g., faults of the magnets of the mover 100 that is being tested, faults of a bearing of the mover, etc.). In some embodiments, the AI fault detector 324 is configured to use the database data from the fault detection database 322 to identify patterns in the sensor feedback and the coil feedback for corresponding track controls while conducting the track test or the mover test. The patterns can indicate the type or cause of the fault. In some embodiments, the first neural network or the second neural network also identify variations or patterns in the shape or frequency of the sensor feedback (e.g., the signals associated with the sensors) to detect the fault or the cause of the fault.

Referring still to FIG. 13, the calibrated mover model 330 can be generated or updated by the model manager 334, according to some embodiments. In some embodiments, the calibrated mover model 330 is configured to predict sensor feedback and coil feedback for corresponding track controls of the linear drive system 300 when conducting the track test with the inspection mover 400. The calibrated mover model 330 may be generated by the model manager 334 using a variety of multi-dimensional regression, curve fitting techniques, transfer functions, etc. In some embodiments, the calibrated mover model 330 is a predetermined model that uses physics-based equations (e.g., Maxwell's Equations, Faraday's law, etc.) or derivations thereof to model corresponding motion of the movers 100 responsive to track controls (e.g., energization of the drive coils 150). In some embodiments, the calibrated mover model 330 is generated based on various specifications or parameters of the linear drive system 300 or the movers 100, including motor voltages, power draw by the drive coils 150, coil currents, expected coil temperatures, dimensions of the movers 100, payload or weight of the movers 100, proportional-integral-derivative indices of the control signal generator 318, tolerances of the track segments 11 and movers 100, types of the sensors 145, operating temperatures, etc. The calibrated mover model 330 can be configured to receive the track controls as an input as well as the measurement data of the inspection mover 400, and predict corresponding motion or sensor feedback and coil feedback for properly operating track segments 11. In this way, the actually obtained coil feedback and sensor feedback can be used in comparison to the outputs of the calibrated mover model 330 to identify faults of various track segments 11.

Referring still to FIG. 13, the calibrated station model 332 may be generated or adjusted similarly to the calibrated mover model 330, but is configured to receive measurement data of the inspection station 402 and the track controls as inputs. In some embodiments, the calibrated station model 332 is similarly configured to output or predict movement of the mover 100 that is being tested, assuming that the mover 100 is functioning properly and is free from faults. The rules-based fault detector 326 may use the outputs of the calibrated station model 332 when performing the mover test for the input track controls, in comparison to the actual feedback obtained (e.g., the sensor feedback and the coil feedback) to identify faults of the mover 100 that is being tested (e.g., in response to the actual feedback differing or deviating from the feedback predicted by the calibrated station model 332). In some embodiments, the AI fault detector 324 is configured to use the outputs of the calibrated mover model 330 or the calibrated station model 332 as inputs to the first neural network or the second neural network, or to train the first neural network or the second neural network.

Referring still to FIG. 13, the virtual mover generator 328 may be configured to generate a model that represents all of the movers 100 (e.g., an average or aggregated operation of the movers 100). The virtual mover generator 328 may obtain the track controls, the coil feedback, and the sensor feedback associated with each of the movers 100, aggregate or average the track controls, the coil feedback, and the sensor feedback, and generate the model that predicts or estimates motion of a virtual mover responsive to track controls. In some embodiments, the virtual mover generator 328 uses one or more model generation techniques, similar to the model manager 334 as described above (e.g., a multi-dimensional regression, populating parameters of a predetermined or predefined model, etc.). The virtual mover may represent all of the movers 100 that are used to generate feedback for generation of the virtual mover (e.g., all of the movers 100 on the linear drive system 300). In some embodiments, the virtual mover is periodically re-updated, calibrated, or re-generated to account for changes (e.g., due to degradation) of the performance of the movers 100. In some embodiments, the virtual mover generator 328 is configured to track changes in the model of the virtual mover to thereby track overall degradation of the movers 100. For example, when the model is first generated by the virtual mover generator 328, the model may predict a first amount of movement of the virtual mover responsive to activation of the drive coils 150 at a first commanded current. At a period of time later (e.g., after some hours or weeks of runtime of the linear drive system 300), the model can be updated or calibrated, and may predict the first amount of movement of the virtual mover responsive to activation of the drive coils at a second commanded current that is greater than the first commanded current, or predict a second amount of movement of the virtual mover that is less than the first amount of movement of the virtual move responsive to activation of the drive coils 150 at the first commanded current. In this way, the change in the commanded current required to induce motion of the virtual mover a certain amount, or the change in the amount of motion of the virtual mover responsive to the same amount of commanded current, may indicate overall degradation of the movers 100. In some embodiments, the model and the overall degradation (or the change in the parameter such as commanded current or predicted amount of motion) can be provided to the rules-based fault detector 326, the AI fault detector 324, and the control signal generator 318. In some embodiments, the control signal generator 318 is configured to use the model of the virtual mover, or the overall degradation of the movers 100 to adjust a control loop (e.g., proportional-integral-derivative control) in order to account for overall degradation of the movers 100.

Referring still to FIG. 13, the rules-based fault detector 326 and/or the AI fault detector 324 may use the model of the virtual mover that represents the collective or aggregated characteristics of the movers 100 to identify faults of one or more movers 100 with respect to the virtual mover. For example, the rules-based fault detector 326 and/or the AI fault detector 324 may perform a statistical analysis to identify outliers of the movers 100 relative to the population-wide responses of the movers 100, represented by the model of the virtual mover that is generated by the virtual mover generator 328. For example, if one of the movers 100 has a response to an operation of the drive coils 150 that differs from the expected or predicted response as determined by the model of the virtual mover by an amount (e.g., a predetermined amount, a standard deviation, a portion of a standard deviation, a statistical outlier, etc.), the rules-based fault detector 326 and/or the AI fault detector 324 may identify that the mover 100 is an outlier, and that the mover 100 may be faulty, or that the mover 100 should be tested to identify if the mover 100 has faulted.

Referring to FIGS. 12-13, the fault detector 312 may also be configured to perform a variety of other diagnostic techniques using the feedback provided from performing the track test or the mover test. For example, the fault detector 312 may perform any of the position sensor offset calibration techniques as described in U.S. application Ser. No. 17/151,387, now U.S. Pat. No. 11,307,067 B2, the entire disclosure of which is incorporated by reference herein, based at least in part on feedback obtained while performing the track test. The fault detector 312 may also perform any of the vehicle dynamic identification techniques as described in U.S. application Ser. No. 15/702,983, now U.S. Pat. No. 11,165,372 B2, the entire disclosure of which is incorporated by reference herein, based at least in part on feedback obtained while performing the mover test. In some embodiments, the fault detector 312 is also configured to perform position sensor gain calibration techniques as described in U.S. application Ser. No. 16/201,464, now U.S. Pat. No. 10,914,620 B2, the entire disclosure of which is incorporated by reference herein, based at least in part on feedback obtained while performing the track test. The fault detector 312 may also be configured to perform any of the sensor and coil defect detection techniques as described in U.S. application Ser. No. 15/701,578, now U.S. Pat. No. 10,562,715 B2, the entire disclosure of which is incorporated by reference herein, based at least in part on feedback obtained while performing the track test. In some embodiments, the fault detector 312 is also configured to perform any of the diagnostic techniques as described in U.S. application Ser. No. 16/739,288, now U.S. Pat. No. 11,459,181 B2, the entire disclosure of which is incorporated by reference herein, based at least in part on feedback obtained while performing at least one of the track test or the mover test. In some embodiments, the fault detector 312 is configured to perform any of the techniques (e.g., thrust monitoring or diagnostic techniques) as described in U.S. application Ser. No. 18/152,888, the entire disclosure of which is incorporated by reference herein, based at least in part on feedback obtained while performing at least one of the track test or the mover test. All of the techniques incorporated by reference herein may benefit from the separation of the inspection vehicle 400 and the calibrated inspection station 402 to provide different reference or baselines.

Processes

Figure 14:
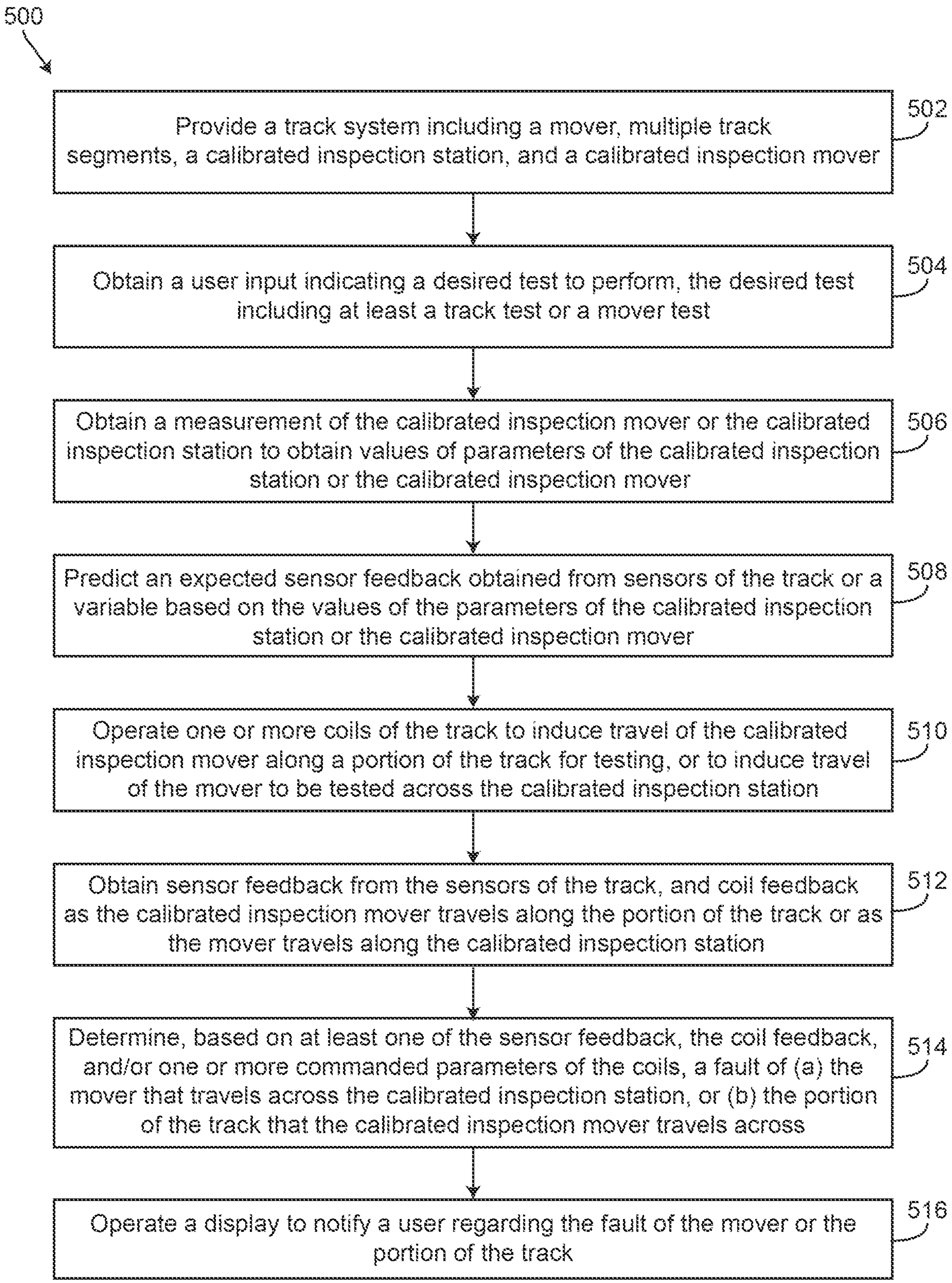
FIG. 14 is a flow diagram of a process for identifying and diagnosing faults of a mover of a linear drive system, according to some embodiments.

Referring to FIG. 14, a process 500 for identifying faults of a mover or vehicle of a linear drive system includes steps 502-516, according to some embodiments. In some embodiments, the process 500 may be performed by the fault detection system 200 for the linear drive system 300. The process 500 can be performed in order to identify or detect faults of one or more movers of the linear drive system 300 (e.g., mover bearing wear, magnet faults, etc.) or faults of one or more track segments 11 of the linear drive system 300 (e.g., coil faults, track bearing faults, position sensor faults, etc.). In some embodiments, the process 500 is performed in a targeted manner (e.g., to test a specific mover 100) or is performed iteratively or periodically for all of the movers 100 of the linear drive system 300 (e.g., at a maintenance or diagnostic time period, or periodically throughout the lifetime of the linear drive system 300).

Process 500 includes providing a track system including a mover, multiple track segments, a calibrated inspection station, and a calibrated inspection mover (step 502), according to some embodiments. In some embodiments, the track system is the linear drive system 300. In some embodiments, the mover is configured to slidably or movably couple with the multiple track segments such that the mover can be induced to travel along the track segments. The track segments may form a closed loop to define a path between different locations. In some embodiments, the mover includes an array or stack of magnets that facilitate motion or induced motion of the mover along the track segments. The track segments may each include one or more drive coils that are energized to produce a magnetic field. The magnetic field induces motion of the movers when the movers are proximate energized drive coils. In this way, the drive coils can be sequentially activated to induce motion of the movers along the track segments. The calibrated inspection mover can be structurally similar to the other movers, but is calibrated or has known characteristics such that it is ensured that fault detection of a track segment is not due to a faulty mover. Similarly, the calibrated inspection station Process 500 includes obtaining a user input indicating a desired test to perform, the desired test including at least a track test or a mover test (step 504), according to some embodiments. In some embodiments, the user input is provided to the central controller 170 via the user interface 302. In some embodiments, the user input includes a request to perform the track test for a specific track segment, or a request to perform the mover test for a specific mover. For example, if the user notices that one of the track segments seems problematic (e.g., all of the movers move slowly over the specific track segment), the user may request that the track test be performed for the specific track segment. Similarly, if the user notices that one of the movers appears to be moving slowly or requiring excessive current to be provided to the drive coils to cause motion of the mover, the user may request that this mover be transported to the calibrated inspection station and undergo the mover test.

Process 500 includes obtaining a measurement of the calibrated inspection mover or the calibrated inspection station to obtain values or parameters of the calibrated inspection station or the calibrated inspection mover (step 506), according to some embodiments. In some embodiments, the measurement of the calibrated inspection mover includes measurement of geometry, tolerances, dimensions, etc., of the physical structure of the calibrated inspection mover. In some embodiments, the measurement of the calibrated inspection mover includes an off-track test to ensure that one or more bearings of the calibrated inspection mover are functioning properly. In some embodiments, the measurement of the calibrated inspection mover includes measuring a strength of the magnetic array or stack of magnets of the calibrated inspection mover. In some embodiments, the measurement of the calibrated inspection mover is provided as an indication that the calibrated inspection mover is properly calibrated (e.g., all measurements within specification), without specific values of the measurements. In some embodiments, the measurement of the calibrated inspection station includes measurements of the drive coils of the calibrated inspection station, visual inspections of wires, cables, and circuitry, testing of the driver module 70 of the calibrated inspection station, or measurements of various geometry, physical surfaces, dimensions, etc., of the physical structure of the calibrated inspection station. In some embodiments, the measurements are used to adjust or determine parameters of a model of the calibrated inspection mover or the calibrated inspection station. In some embodiments, step 506 is performed by the central controller 170 by receiving a user input from the user interface 302 or the cloud computing system 304 that includes the measurements of the calibrated inspection mover or the calibrated inspection station.

Process 500 includes predicting an expected sensor feedback obtained from sensors of the track or a variable based on the values of the parameters of the calibrated inspection station or the calibrated inspection mover (step 508), according to some embodiments. In some embodiments, step 508 is performed using a predictive model that models behavior and responses (e.g., sensor feedback) of the linear drive system 300 for the calibrated inspection mover or the calibrated inspection station. In some embodiments, step 508 is performed by the calibrated mover model 330 or the calibrated station model 332. For example, step 508 may include performing a simulation of the model for a specific test control profile (e.g., simulated response of the calibrated inspection mover across a track segment that is operating properly, or simulated response of the calibrated inspection station and a mover moving across the calibrated inspection station assuming the mover is operating properly). In some embodiments, step 508 includes using an equation, a heuristics, or a set of steps to predict a range of normal sensor feedback for the track test or the mover test.

Process 500 includes operating one or more coils of the track to induce travel of the calibrated inspection mover along a portion of the track for testing, or to induce travel of the mover to be tested across the calibrated inspection station (step 510), according to some embodiments. In some embodiments, step 510 is performed by the central controller 170 and the segment controllers 50 of the track segments 11. In some embodiments, step 510 is performed by the control manager 316 and the control signal generator 318 of the central controller 170. For example, responsive to the user input, the type of test requested to be performed (e.g., the track test or the mover test), and the specific mover or track segment to be tested, the control manager 316 may generate test steps to cause transportation of a specific mover 100 to the calibrated inspection station 402 and operate the drive coils 150 of the calibrated inspection station 402 according to a test wave form. Similarly, the control manager 316 may generate or retrieve test steps to cause transportation of the inspection mover 400 (e.g., by energizing the drive coils 150) along a specific one or more track segments 11. Step 510 may include clearing other movers from the portion of the track for testing prior to operating the coils of the track to induce travel of the calibrated inspection mover to and along the portion of the track for testing.

Process 500 includes obtaining sensor feedback from the sensors of the track, and coil feedback, as the calibrated inspection mover travels along the portion of the track or as the mover travels along the calibrated inspection station (step 512), according to some embodiments. In some embodiments, step 512 includes obtaining the sensor feedback from the sensors 145 and the coil feedback from the drive coils 150 (e.g., via the segment controllers 50). In some embodiments, step 512 is performed by the central controller 170. In some embodiments, the sensor feedback and the coil feedback are obtained for a time period during which the test (e.g., the track test or the mover test) is performed. In some embodiments, the sensor feedback indicates position of the mover 100 that is being tested or the inspection mover 400 along the track segments 11, and a rate of change of the sensor feedback (e.g., an amount of time between sequential activation of sensors 145) indicates speed of the mover 100 or the inspection mover 400. In some embodiments, the coil feedback indicates an amount of current that is actually present in each of the drive coils 150 when activated. In some embodiments, step 512 also includes obtaining control signals that are provided to the drive coils 150 to perform the test (e.g., commanded current).

Process 500 includes determining, based on at least one of the sensor feedback, the coil feedback, and/or one or more commanded parameters of the coils, a fault of (a) the mover that travels across the calibrated inspection station, or (b) the portion of the track that the calibrated inspection mover travels across (step 514), according to some embodiments. In some embodiments, step 514 is performed by the fault detector 312. In some embodiments, step 514 is also performed based on the prediction of the expected sensor feedback or the variable (e.g., the results of step 508). In some embodiments, step 514 includes using a rules-based technique or a neural network technique to determine the fault of the mover or the portion of the track. In some embodiments, step 514 includes comparing the predicted or expected sensor feedback to the received feedback to identify that the fault has occurred at the track or the mover. For example, if a track test is being performed along one or more portions of the track, and the sensor feedback obtained while operating the calibrated inspection mover 400 along the one or more portions of the track does not match the predicted or expected feedback, the fault detector 312 may determine that the one or more portions of the track are faulty. Similarly, if a mover test is being performed on a specific mover, and the sensor feedback obtained while operating the specific mover 100 along the inspection station 402 does not match the predicted or expected sensor feedback, the fault detector 312 determines that the specific mover is faulty. Step 514 may also include determining a type or cause of the fault using any of the techniques described in greater detail above with reference to the fault detector 312 (e.g., comparing the commanded current to the actual current in the drive coils 150 to identify faulty drive coils 150, etc.). The fault of the mover may include any of a magnet array damage (e.g., damage to the magnets 120 of one of the movers 100), bearing wear damage (e.g., wear to the bearings 131 of the mover 100), or mover identification verification. The fault of the portion of the track may include identifying debris on the track, a bearing wear of the track (e.g., wear to a gliding bearing that is disposed on the track such as a plastic or soft material), position sensor malfunctioning of the track, drive coil or current driver performance issues, or other mechanical changes that affect motor gaps.

Process 500 includes operating a display to notify a user regarding the fault of the mover or the portion of the track (step 516), according to some embodiments. In some embodiments, step 516 includes presenting a visual indication of a particular mover or track segment that has faulted, as well as a cause or type of the fault. In some embodiments, step 516 includes prompting the user to repair or perform an inspection of the mover or the portion of the track that has faulted. Step 516 may also include generating a graphical user interface (GUI) including identifications of multiple movers and/or track segments including information regarding the operating status of the movers and the track segments. In some embodiments, step 516 includes intelligent vehicle status reporting by providing a graphical display of the track and the movers (e.g., a graphical representation) illustrating various parameters of the track or the movers, and performance parameters (e.g., reliability of position sensors, etc.).

Figure 15:
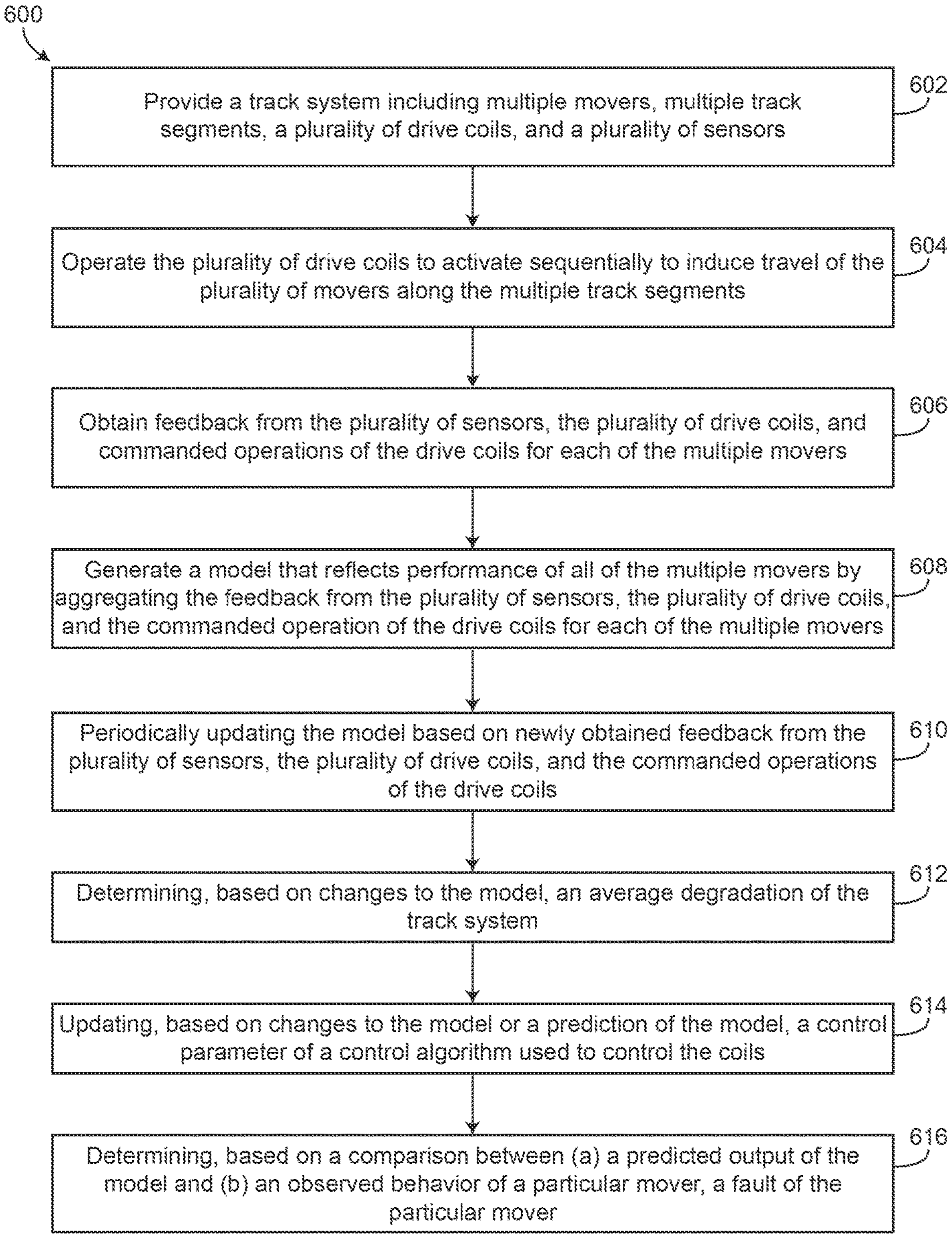
FIG. 15 is a flow diagram of a process for identifying and diagnosing faults of one or more track segments of a linear drive system, according to some embodiments.

Referring to FIG. 15, a process 600 for generating a virtual mover or model that represents all movers of a track system includes steps 602-616, according to some embodiments. In some embodiments, the process 600 is performed in order to generate a model or a virtual mover using aggregated sensor data across all movers of a track system. The virtual mover can be used to identify movers that are operating in a manner that deviates from the virtual mover (e.g., operational outlier) and therefore may have faults, or identify overall degradation of the system (e.g., by tracking changes to the virtual mover or parameters of the virtual mover over time).

The process 600 includes providing a track system including multiple movers, multiple track segments, a plurality of drive coils, and a plurality of sensors (step 602), according to some embodiments. In some embodiments, step 602 is the same as or similar to step 502 of process 500.

The process 600 includes operating the plurality of drive coils to activate sequentially to induce travel of the plurality of movers along the multiple track segments (step 604), according to some embodiments. In some embodiments, step 604 is performed according to a control algorithm to individually move the plurality of movers according to a desired path and speed of motion (e.g., to transport materials between locations along the track segments). In some embodiments, step 604 is performed by the central controller 170 and the segment controllers 50 by sequentially activating the drive coils 150 to thereby induce motion of the movers of the track system.

The process 600 includes obtaining feedback from the plurality of sensors, the plurality of drive coils, and commanded operations of the drive coils for each of the multiple movers (step 606), according to some embodiments. In some embodiments, the feedback is obtained by the central controller 170 for performing a regression or model generation technique. In some embodiments, the feedback is used to calculate one or more parameters of the movers and the parameters are aggregated or average to produce the virtual mover.

The process 600 includes generating a model that reflects performance of all of the multiple movers by aggregating the feedback from the plurality of sensors, the plurality of driver coils, and the commanded operation of the drive coils for each of the multiple movers (step 608), according to some embodiments. In some embodiments, step 608 is performed by using a model generation technique, a regression technique, a neural network training technique, a machine learning technique, etc., to generate the model. In some embodiments, the model predicts feedback of the plurality of sensors or the plurality of drive coils as a function of commanded operation of the drive coils. In some embodiments, step 608 is performed by the virtual mover generator 328 of the central controller 170.

The process 600 includes periodically updating the model based on newly obtained feedback from the plurality of sensors, the plurality of drive coils, and the commanded operation of the drive coils (step 610), according to some embodiments. In some embodiments, step 610 includes re-performing step 608 in order to generate a new model. In some embodiments, step 610 includes tuning the model that is generated in step 608 by adjusting one or more parameters of the model using a tuning technique (e.g., parameters that define the relationship between the outputs of the model such as the predicted feedback from the plurality of sensors and the plurality of drive coils or predicted motion of the virtual mover and inputs of the model such as activation of drive coils according to a commanded current). In some embodiments, step 610 is also performed by the virtual mover generator 328 of the central controller 170.

The process 600 also includes determining, based on changes to the model, an average degradation of the track system (step 612), according to some embodiments. In some embodiments, step 612 includes tracking changes of the parameters of the model over time (e.g., when step 610 is performed relative to the parameters of previous iterations of step 610 or relative to the parameters determined by performing step 608). In some embodiments, step 612 includes identifying or calculating changes in the outputs of the model (e.g., a deviation) for a same input. In some embodiments, step 612 includes identifying or calculating changes in the outputs of the model that are required to achieve a same output. In some embodiments, step 612 is performed by the reporting manager 314 or by the virtual mover generator 328.

The process 600 also includes updating, based on changes to the model or a prediction of the model, a control parameter of a control algorithm used to control the coils (step 614), according to some embodiments. In some embodiments, the changes to the model (e.g., the parameters of the model) or the prediction of the model indicates overall or average system degradation of the track system. In some embodiments, the overall or average system degradation is used by the control manager 316 or the control signal generator 318 to adjust a control algorithm used to generate the track controls. For example, as degradation of the system increases, the drive coils 150 may need to be activated with a different current (e.g., a higher commanded current) in order to achieve the requested motion of the movers. In some embodiments, the degradation of the system may indicate a trigger for servicing or replacement of the system.

The process 600 includes updating, determining, based on a comparison between (a) a predicted output of the model and (b) an observed behavior of a particular mover, a fault of the particular mover (step 616), according to some embodiments. In some embodiments, step 616 includes comparing the predicted output of the model to the observed behavior of the particular mover, and if the observed behavior of the particular mover deviates from the predicted output (e.g., is an outlier) by a threshold amount, determining that the particular mover is faulty and needs to be serviced. In some embodiments, process 600 can initiate the process 500 to initiate testing of the particular mover. In some embodiments, process 600 includes operating the drive coils according to the updated control parameter, and/or a providing a notification of the average degradation of the track system to a user.

System Model and Diagnostics Improvements

Referring again to FIGS. 11 and 12, the central controller 170 and/or the cloud computing system 304 may be configured to use, generate, tune, adjust, etc., a predictive model of the linear drive system 300, track portions of the linear drive system 300, movers 100 of the linear drive system 300, etc., or any combination thereof. In some embodiments, the predictive model is a digital twin of the linear drive system 300 that is used by the central controller 170 and/or the cloud computing system 304 for closed-loop feedback control of the linear drive system 300, diagnostics of the linear drive system 300, making predictions of performance or operation of the linear drive system 300, and/or the generation of user interfaces, displays, dashboards, system analysis, etc., of the linear drive system 300. In some embodiments, parameters or variables of the predictive model or digital twin of the linear drive system 300 may be adjusted, tuned, or generated based on outputs of the fault detector 312, results of the mover test or track test, or feedback from the inspection station 402 and/or track segments 11 as the inspection mover 400 travels along the track segments 11. In some embodiments, the digital twin that is implemented by the central controller 170 and/or the cloud computing system 304 is the same as or similar to the model or digital twin described in greater detail in U.S. application Ser. No. 17/033,180, filed Sep. 25, 2020, the entire disclosure of which is incorporated by reference herein. For example, the modeling techniques or the digital twinning techniques described in U.S. application Ser. No. 17/033,180 may use the results of the track test or the mover test as inputs in order to tune, adjust, or generate parameters or models of the model or the digital twin. In some embodiments, the central controller 170 and/or the cloud computing system 304 are also configured to implement any of the digital twinning techniques described in U.S. application Ser. No. 18/079,254, filed Dec. 12, 2022, the entire disclosure of which is incorporated by reference herein. For example, the results of the track test or the mover test can be used to improve diagnostics (e.g., degradation estimation based on time measurements of movers to move along a track) or twinning techniques that are described in U.S. application Ser. No. 18/079,254.

Repair Vehicles

Figure 16:
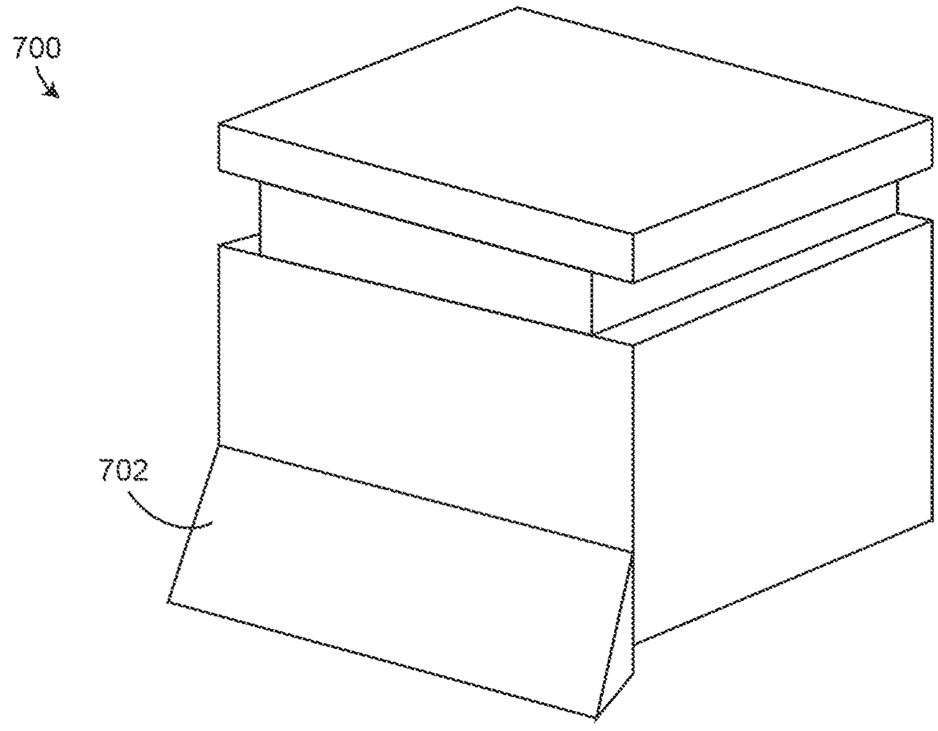
FIG. 16 is a perspective view of a service vehicle or repair mover for the linear drive system of FIG. 1 including a bumper, according to some embodiments.

Referring to FIG. 16, one of the movers 100 may be provided as a service or repair vehicle, shown as repair vehicle 700, according to some embodiments. The repair vehicle 700 may include a bumper 702 (e.g., a physical structure positioned on a front of the repair vehicle 700) that is configured to clear debris or blockages left on the track segments 11 if no vehicle or mover 100 is present. In some embodiments, the repair vehicle 700 may also be configured to push an unlocated or dysfunctional vehicle to the inspection station 402 for testing or identification. Advantageously, the repair vehicle 700 can be useful in collision recovery, especially in large track systems with limited access by technicians.

Figure 17:
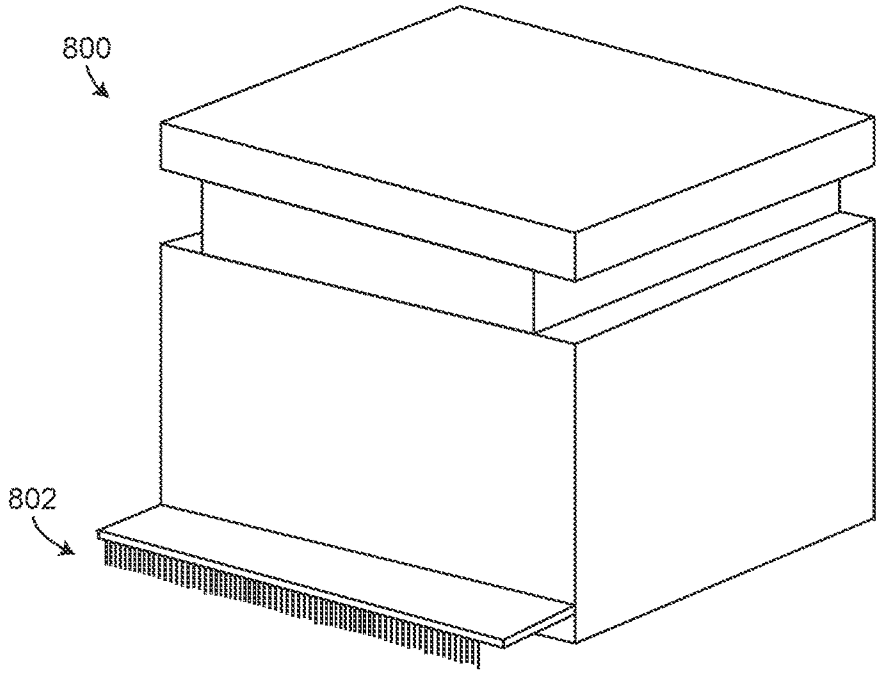
FIG. 17 is a perspective view of a service vehicle or repair mover for the linear drive system of FIG. 1 including a brush, according to some embodiments.

Referring to FIG. 17, one of the movers 100 may be provided as a repair or cleaning vehicle, shown as repair vehicle 800, according to some embodiments. The repair vehicle 800 may include brushes 802 that are positioned on a front, underneath, on sides, etc., or any combination thereof of the repair vehicle 800. The brushes 802 may abut or contact the track segments 11 as the repair vehicle 800 moves along the track segments 11, thereby cleaning debris from the track segments 11.

Figure 18:
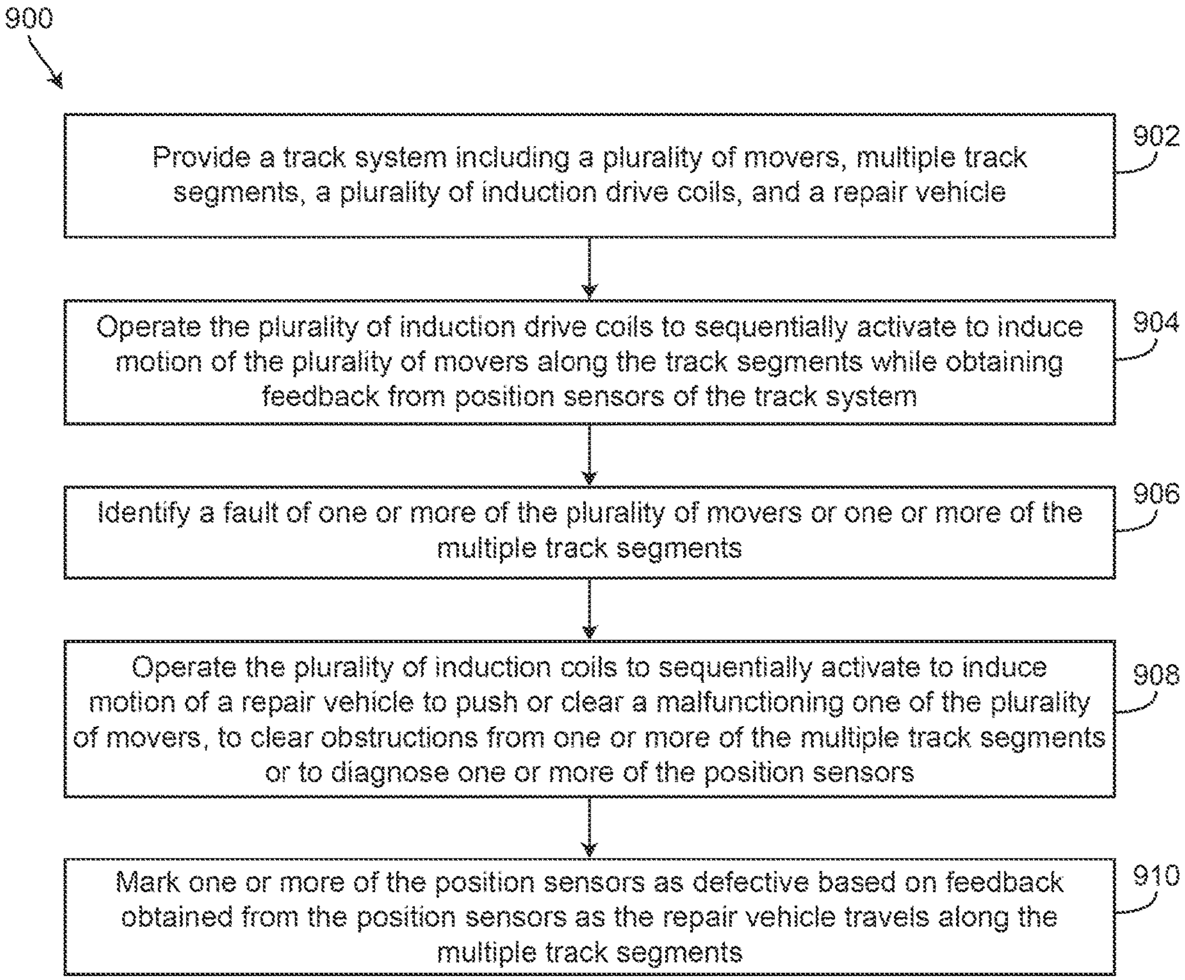
FIG. 18 is a flow diagram of a process for repairing one or more segments of a track of a linear drive system, according to some embodiments.

Referring to FIG. 18, a flow diagram of a process 900 for repairing one or more track segments or movers of a linear drive system (e.g., linear drive system 300) includes steps 902-910, according to some embodiments. In some embodiments, the process 900 is performed by the fault detection system 200, and at least one of the repair vehicle 700 or the repair vehicle 800. In some embodiments, the process 900 is performed in order to repair or perform a responsive action to detection of a stalled or inoperational vehicle, an obstruction on the track, faulted position sensors, etc.

The process 900 includes providing a track segment including a plurality of movers, multiple track segments, a plurality of induction drive coils, and a repair vehicle (step 902), according to some embodiments. In some embodiments, step 902 is the same as or similar to step 502 of the process 500 or step 602 of the process 600. In some embodiments, the track system is the linear drive system 300. In some embodiments, the repair vehicle includes a bumper (e.g., the repair vehicle 700) or a brush (e.g., the repair vehicle 800) such that the repair vehicle can clear obstructions from one or more of the track segments, push immobilized vehicles or movers off the track, or clean the track segments. In some embodiments, the repair vehicle includes a calibrated magnet array and the repair vehicle is configured to communicate with the central controller 170 such that one or more malfunctioning position sensors can be identified and marked such that the control signal generator 318 or the control manager 316 skip feedback from the malfunctioning position sensors when performing closed loop control of the plurality of movers (e.g., during normal operation).

The process 900 includes operating the plurality of induction drive coils to sequentially activate in order to induce motion of the plurality of movers along the track segments while obtaining feedback from position sensors of the track system (step 904), according to some embodiments. In some embodiments, step 904 is performed by the central controller 170 (e.g., the control manager 316 and/or the control signal generator 318) using sensor feedback from the position sensors 145 as the plurality of movers transport along the track segments. In some embodiments, step 904 includes performing closed loop control by sequentially activating the drive coils 150 while obtaining feedback from the position sensors 145 and using the sensor feedback to track positions of the movers.

The process 900 includes identifying a fault of one or more the plurality of movers or one or more of the multiple track segments (step 906), according to some embodiments. In some embodiments, step 906 is performed by using any of the techniques described in greater detail above with reference to FIGS. 10-15. For example, the fault of the plurality of track segments may be determined based on the results of performing the process 500. In some embodiments, step 906 includes detecting that a certain of the position sensors consistently (e.g., over time for multiple of the plurality of movers) provides sensor feedback that is incorrect compared to other sensor feedback from other position sensors, and determining that the position sensor has likely faulted. The step 906 may also include identifying that one or more of the vehicles are unable to pass a certain location or that the plurality of movers consistently slow down when traveling over a particular track segment which may indicate an obstruction is present at the particular track segment.

The process 900 includes operating the plurality of induction coils to sequentially activate to induce motion of a repair vehicle to push or clear a malfunctioning one of the plurality of movers, to clear obstructions from one or more of the multiple track segments, or to diagnose one or more of the position sensors (step 908), according to some embodiments. In some embodiments, step 908 is performed in order to transport the repair vehicle 700 (e.g., equipped with the bumper 702) to a location on the track segments where a malfunctioning vehicle is positioned in order to push the malfunctioning vehicle to a repair station or the inspection station 402 (e.g., for vehicle identification). In some embodiments, step 908 is performed in order to transport the repair vehicle 700 or the repair vehicle 800 to clear obstructions from a particular location on the track segments. In some embodiments, the repair vehicle 700 and/or the repair vehicle 800 includes calibrated position magnets 140 such that the sensor feedback obtained from the position sensors 145 of the track segments can be compared to an expected feedback in order to determine if one or more of the position sensors 145 are malfunctioning or have undergone a fault.

The process 900 includes marking one or more of the position sensors as defective based on feedback obtained from the position sensors as the repair vehicle travels along the multiple track segments (step 910), according to some embodiments. In some embodiments, step 910 is performed when the sensor feedback obtained from one or more of the position sensors 145 deviates from an expected feedback as the repair vehicle 700 and/or the repair vehicle 800 travels over the track segments. Responsive to determining that the sensor feedback obtained from the one or more position sensors deviates from the expected feedback (e.g., indicating that the one or more position sensors 145 have faulted), the central controller 170 may mark the faulted position sensors 145 as defective such that the sensor feedback from the faulted position sensors 145 is ignored by the control manager 316 and/or the control signal generator 318 and is not used for generating control signals for the induction drive coils (e.g., the drive coils 150) until the faulted position sensors 145 are replaced or repaired by a technician.

Alternative Implementations and Advantages

Referring to FIGS. 10-18, the techniques described herein with reference to the fault detection system 200 for the linear drive system 300 may be applicable to other implementations and should not be understood as being limited to a linear drive system. For example, the fault detection system 200 and techniques described herein may facilitate high precision stationary positioning of a drivable or movable element for placing and biological filling or sampling of a bio-system. The fault detection system 200 and techniques described herein may also facilitate improved precision and low-variation continuous movement of a tracked mover system which may be advantageous for 3D printing or deposition systems. The fault detection system 200 may also facilitate reduced downtime or inoperational time of the linear drive system 300 as well as automated preventative maintenance. The fault detection system 200 may also provide data for further technologies of controls or vehicle identification to use. The fault detection system 200 or techniques thereof may also be applicable to autonomous mobile robot (AMR) systems or an automated guided vehicle (AGR) system (e.g., a system that includes movers that travel on fixed guide rails). The techniques of the fault detection system 200 (e.g., the inspection station 402 and the inspection mover 404 may also be retrofit periodically to other track systems such that the techniques of the fault detection system 200 can be performed for customers as a requested service, even if the other track systems do not permanently include the fault detection system 200.

Configuration of the Exemplary Embodiments

As utilized herein with respect to numerical ranges, the terms "approximately," "about," "substantially," and similar terms generally mean +/−10% of the disclosed values. When the terms "approximately," "about," "substantially," and similar terms are applied to a structural feature (e.g., to describe its shape, size, orientation, direction, etc.), these terms are meant to cover minor variations in structure that may result from, for example, the manufacturing or assembly process and are intended to have a broad meaning in harmony with the common and accepted usage by those of ordinary skill in the art to which the subject matter of this disclosure pertains. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

References herein to the positions of elements (e.g., "top," "bottom," "above," "below") are merely used to describe the orientation of various elements in the FIGURES. It should be noted that the orientation of various elements may differ according to other exemplary embodiments, and that such variations are intended to be encompassed by the present disclosure.

The hardware and data processing components used to implement the various processes, operations, illustrative logics, logical blocks, modules and circuits described in connection with the embodiments disclosed herein may be implemented or performed with a general purpose single- or multi-chip processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function. The memory (e.g., memory, memory unit, storage device) may include one or more devices (e.g., RAM, ROM, Flash memory, hard disk storage) for storing data and/or computer code for completing or facilitating the various processes, layers and modules described in the present disclosure. The memory may be or include volatile memory or non-volatile memory, and may include database components, object code components, script components, or any other type of information structure for supporting the various activities and information structures described in the present disclosure. According to an exemplary embodiment, the memory is communicably connected to the processor via a processing circuit and includes computer code for executing (e.g., by the processing circuit or the processor) the one or more processes described herein.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It is important to note that the construction and arrangement of the systems and components shown in the various exemplary embodiments is illustrative only. Additionally, any element disclosed in one embodiment may be incorporated or utilized with any other embodiment disclosed herein. For example, the techniques and controls of the control signal generator 318 of the exemplary embodiment shown in at least FIG. 12 may be incorporated in the segment controllers 50 of the exemplary embodiment shown in at least FIG. 8. Although only one example of an element from one embodiment that can be incorporated or utilized in another embodiment has been described above, it should be appreciated that other elements of the various embodiments may be incorporated or utilized with any of the other embodiments disclosed herein.

What is claimed is:

1. A system for detecting a fault of a linear drive system, the system comprising:

a track comprising a plurality of track segments defining a path along which a plurality of movers travel and a plurality of drive coils configured to induce travel of the plurality of movers along the track;

a calibrated inspection apparatus comprising at least one of (i) a calibrated inspection mover configured to travel along the track or (ii) a calibrated inspection station comprising one or more of the plurality of track segments; and processing circuitry configured to:

obtain feedback signals from one or more controllers for the plurality of track segments, the feedback signals characterizing relative motion between the calibrated inspection apparatus and at least one of (i) the plurality of track segments or (ii) the plurality of movers; and determine a fault based on a deviation between the feedback signals and a predicted response of the linear drive system to a control input, the predicted response determined based on one or more calibrated characteristics of the calibrated inspection apparatus, the fault comprising at least one of (i) a track segment fault in the plurality of track segments or (ii) a mover fault in the plurality of movers.

2. The system of claim 1, wherein the calibrated inspection station is positioned on a bypass track defining a bypass path in parallel with one or more of the plurality of track segments, wherein the processing circuitry is further configured to cause a tested mover of the plurality of movers to travel along the bypass path in response to a signal to inspect the tested mover.

3. The system of claim 1, wherein:

the plurality of drive coils are configured to be energized sequentially to induce the travel of the plurality of movers along the track, wherein a degree of energization of the plurality of drive coils corresponds to a speed or thrust of the travel of the plurality of movers;

the track comprises a plurality of sensors and the feedback signals comprise position signals characterizing the relative motion between the calibrated inspection apparatus and at least one of (i) the plurality of track segments or (ii) the plurality of movers, wherein the position signals indicate a position and speed of each of the plurality of movers or the calibrated inspection mover along the track.

4. The system of claim 1, wherein the one or more calibrated characteristics of the calibrated inspection apparatus comprise at least one of a calibrated magnet array of the calibrated inspection mover, calibrated bearings and wheels of the calibrated inspection mover, calibrated vertical gaps between the calibrated inspection mover and the track, or a calibrated weight of the calibrated inspection mover.

5. The system of claim 1, wherein the feedback signals comprise an actual current through the plurality of drive coils, wherein the processing circuitry is configured to determine the fault by performing a track test comprising:

causing sequential energization of the plurality of drive coils according to a commanded current to induce travel of the calibrated inspection mover along the plurality of track segments; and determining, based on the commanded current of the plurality of drive coils and the actual current through the plurality of drive coils, a fault of one of more of the plurality of track segments.

6. The system of claim 1, wherein determining the fault comprises at least one of:

identifying a sensor fault of one or more of a plurality of sensors of the track based on at least one of an amplitude or shape of a position signal obtained from the one or more of the plurality of sensors differing from an expected amplitude or shape;

identifying a coil fault based on an actual coil current differing from a commanded current of one of the plurality of drive coils; or identifying a track bearing wear fault or a debris on track fault based on the commanded current corresponding to the actual coil current and exceeding a value predicted to induce the travel of the calibrated inspection mover.

7. The system of claim 1, wherein the processing circuitry is configured to:

determine, based on position signals obtained from position sensors of the track, an actual position of the calibrated inspection mover;

determine, based on one or more characteristics of the calibrated inspection mover, a commanded current to the plurality of drive coils, and a predictive model, a predicted position of the calibrated inspection mover along the track responsive to the commanded current;

determine, based on the actual position differing from the predicted position, a track bearing wear fault or a debris on track fault.

8. The system of claim 1, wherein the calibrated inspection station comprises a plurality of calibrated sensors, a calibrated coil and current driver, and a calibrated track segment, wherein the processing circuitry is configured to perform a mover test by:

causing sequential energization of the plurality of drive coils to induce travel of a tested mover of the plurality of movers along the calibrated inspection station;

operating the calibrated coil according to a predetermined test profile while obtaining position signals from the plurality of calibrated sensors;

determining, based on at least one of the position signals from the plurality of calibrated sensors or a commanded current of the calibrated coil, a fault at the tested mover, the fault comprising at least one of a bearing wear fault or a magnet array fault of the tested mover.

9. The system of claim 1, wherein the processing circuitry is configured to determine the fault by:

determining, based on the feedback signals, the fault and a type of the fault using a neural network trained using aggregated data of the feedback signals and corresponding faults and types of faults.

10. The system of claim 1, wherein the processing circuitry is further configured to:

aggregate the feedback signals associated with the plurality of movers;

generate a model of a virtual mover, the model of the virtual mover including attributes that are representative of the plurality of movers; and predict, based on changes of the attributes of the model of the virtual mover over time, a compensation for wear of the plurality of movers.

11. A method for detecting a fault of a linear drive system, the method comprising:

operating a plurality of drive coils to induce travel of a plurality of movers along a track, the track having a plurality of track segments defining a path along which the plurality of movers travel;

providing a calibrated inspection apparatus comprising at least one of (i) a calibrated inspection mover of the plurality of movers or (ii) a calibrated inspection station of the plurality of track segments;

obtaining feedback signals from one or more controllers for the plurality of track segments, the feedback signals characterizing relative motion between the calibrated inspection apparatus and at least one of (i) the plurality of track segments or (ii) the plurality of movers; and determining a fault based on a deviation between the feedback signals and a predicted response of the linear drive system to a control input, the predicted response based on one or more calibrated characteristics of the calibrated inspection apparatus, the fault comprising at least one of (i) a track segment fault in the plurality of track segments or (ii) a mover fault in the plurality of movers.

12. The method of claim 11, further comprising performing a track test by:

causing sequential activation of the plurality of drive coils according to a commanded current to induce the travel of the calibrated inspection mover along the plurality of track segments; and determining, based on position signals obtained from a plurality of sensors of the track, the commanded current of the plurality of drive coils, and an actual current through the plurality of drive coils, a fault of one of more of the plurality of track segments.

13. The method of claim 12, further comprising:

identifying a sensor fault of one or more of the plurality of sensors of the track based on at least one of an amplitude or shape of the position signals obtained from the one or more of the plurality of sensors differing from an expected amplitude or shape;

identifying a coil fault based on an actual coil current differing from the commanded current; and identifying a track bearing wear fault or a debris on track fault based on the commanded current corresponding to the actual coil current and exceeding a value predicted to induce the travel of the calibrated inspection mover.

14. The method of claim 12, further comprising:

determining, based on the position signals, an actual position of the calibrated inspection mover;

determining, based on one or more characteristics of the calibrated inspection mover, the commanded current, and a predictive model, a predicted position of the calibrated inspection mover along the track responsive to the commanded current;

determining, based on the actual position differing from the predicted position, a track bearing wear fault or a debris on track fault.

15. The method of claim 11, further comprising performing a mover test by:

causing sequential energization of the plurality of drive coils to induce the travel of a first mover of the plurality of movers to the calibrated inspection station;

operating a calibrated coil according to a predetermined test profile while obtaining position signals from a plurality of calibrated sensors of the calibrated inspection station;

determining, based on at least one of the position signals from the plurality of calibrated sensors or a commanded current of the calibrated coil, a fault at the first mover of the plurality of movers, the fault comprising at least one of a bearing wear fault or a magnet array fault of the first mover of the plurality of movers.

16. A method for detecting a fault of a linear drive system and controlling the linear drive system, the method comprising:

performing a measurement of a characteristic of a calibrated inspection mover or a calibrated inspection station;

controlling activation of a plurality of coils of a track of the linear drive system to at least one of (i) conduct a track test of a tested segment of the track by transporting the calibrated inspection mover along the tested segment of the track or (ii) conduct a mover test by transporting a tested mover along the calibrated inspection station;

obtaining sensor feedback from sensors of the track while conducting at least one of the track test or the mover test; and determining at least one of a fault of the tested mover or a fault of the tested segment of the track based on a deviation between the sensor feedback and a predicted response of the linear drive system to a control input, the predicted response determined based on the measurement of the characteristic of the calibrated inspection mover or the calibrated inspection station.

17. The method of claim 16, wherein determining the at least one of the fault of the tested mover or the fault of the tested segment of the track comprises:

determining a predicted response of the calibrated inspection mover or the tested mover to a test profile based on the measurement of the characteristic of the calibrated inspection mover or the calibrated inspection station;

determining an actual response of the calibrated inspection mover or the tested mover to the test profile by activating the plurality of coils of the track of the linear drive system according to the test profile when performing the track test or the mover test, the actual response indicated by the sensor feedback; and comparing the actual response of the calibrated inspection mover or the tested mover to the predicted response of the calibrated inspection mover or the tested mover, wherein a deviation of the actual response from the predicted response indicates the fault of the tested mover or the fault of the tested segment of the track.

18. The method of claim 16, further comprising:

obtaining sensor feedback and corresponding control commands of each of a plurality of different movers;

generating, based on the sensor feedback and the corresponding control commands of each of the plurality of different movers, an aggregated model of the plurality of different movers, the aggregated model being a virtual representation of a virtual mover that reflects characteristics of each of the plurality of different movers;

updating or calibrating the aggregated model; and responsive to changes in the aggregated model indicating degradation of the plurality of different movers, adjusting a control scheme for each of the plurality of different movers.

19. The method of claim 16, further comprising:

providing a repair mover, the repair mover comprising at least one of a bumper or a brush; and controlling activation of the plurality of coils to transport the repair mover along a particular location on the track where a fault is detected and clear debris off the track using the bumper or the brush.

20. The method of claim 19, further comprising:

conducting sensors tests of each of a plurality of sensors of the track;

identifying defective sensors based on sensor feedback from each of the plurality of sensors; and marking the defective sensors and modifying a control algorithm for controlling energization of the plurality of coils such that the control algorithm does not use feedback from the defective sensors as inputs to the control algorithm.

* * * * *